(12) United States Patent
Gunturi et al.

(10) Patent No.: US 11,757,479 B2
(45) Date of Patent: Sep. 12, 2023

(54) ENHANCING TX-TX ISOLATION THROUGH DIGITAL PRE-COMPENSATION

(71) Applicant: Texas Instruments Incorporated, Dallas, TX (US)

(72) Inventors: Sarma Sundareswara Gunturi, Bengaluru (IN); Venkateshwara Reddy Pothapu, Bengaluru (IN); Chandrasekhar Sriram, Chennai (IN); Raju Kharataram Chaudhari, Pune (IN); Sai Vaibhav Batchu, Kakinada (IN); Pankaj Gaur, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/489,381

(22) Filed: Sep. 29, 2021

(65) Prior Publication Data

US 2022/0271783 A1 Aug. 25, 2022

(30) Foreign Application Priority Data

Feb. 22, 2021 (IN) .............................. 202141007350

(51) Int. Cl.
*H04B 1/04* (2006.01)
*H03G 3/30* (2006.01)

(52) U.S. Cl.
CPC ......... *H04B 1/0475* (2013.01); *H03G 3/3036* (2013.01); *H03G 2201/106* (2013.01)

(58) Field of Classification Search
CPC ............... H04B 1/0475; H03G 3/3036; H03G 2201/106
USPC ........................................................ 375/296
See application file for complete search history.

(56) References Cited

U.S. PATENT DOCUMENTS

| | | | |
|---|---|---|---|
| 2010/0316157 A1* | 12/2010 | Bassam ............. | H04L 25/03343 375/267 |
| 2018/0167092 A1* | 6/2018 | Hausmair ............ | H04B 1/0483 |
| 2021/0013975 A1* | 1/2021 | Jacquet .................... | H01Q 3/42 |

* cited by examiner

*Primary Examiner* — Kevin M Burd
(74) *Attorney, Agent, or Firm* — John R. Pessetto; Frank D. Cimino

(57) ABSTRACT

A TX-TX pre-compensation system that estimates unwanted coupling in a victim transmit chain caused by an aggressor transmit chain and injects a pre-compensation signal to cancel out the estimated coupling. In some embodiments, a signal measurement module estimates the amplitude, phase, and envelope delay of the coupling and an isolation pre-compensation module generates the pre-compensation signal based on the estimated amplitude, the estimated phase, the estimated envelope delay, and the difference between the carrier frequencies of the transmit chains. Since the phase of the coupling may be affected by the carrier frequency of the transmit chains, in some embodiments the phase of the pre-compensation signal is adjusted in response to a change in carrier frequency. Since the amplitude of the coupling may be affected by attenuator gain settings, in some embodiments the amplitude of the pre-compensation signal may be adjusted in response to a change in attenuator gain setting.

14 Claims, 9 Drawing Sheets

ENHANCING TX-TX ISOLATION THROUGH DIGITAL PRE-COMPENSATION

CROSS REFERENCE TO RELATED APPLICATION

This application claims priority to India Provisional Application No. 202141007350, filed Feb. 22, 2021, which is hereby incorporated by reference.

BACKGROUND 5G base stations utilize many antennas to achieve higher performance. A multiple-input and multiple-output (MIMO) base station, for example, may include 32 or even 64 transmit chains and 32 (or 64) receive chains for beamforming and spatial multiplexing. These base stations have stringent performance requirements regarding error vector magnitude (EVM), transmit spectral emissions, etc.

RF-sampling transceivers with multiple transmit chains and multiple receive chains are utilized in many MIMO base stations. Multiple impairments or signal processing modules in the transceivers impact the EVM and emissions performance. For example, the digital pre-distortion (DPD) skirt may cause transmit emission in near band frequencies, crest factor reduction (CFR) may cause in-band noise addition, and coupling between transmit chains may cause local oscillation (LO) phase noise and in-band and near-band noise addition.

A small form factor enables a low area and low cost for some MIMO solutions. However, a small form factor significantly reduces the spacing between the transmit chains, increasing the coupling between transmit and/or receive chains and degrading system performance.

Accordingly, there is a need to improve isolation between base station transmit and/or receive chains to reduce—or compensate for—unwanted coupling between those base station transmit/receive chains.

SUMMARY

The disclosed TX-TX pre-compensation system pre-compensates for unwanted coupling between transmit chains by estimating coupling in a victim transmit chain caused by an aggressor transmit chain and generating and injecting a pre-compensation signal to pre-compensate for—i.e., cancel out—the estimated coupling in the victim transmit chain.

In some embodiments, a signal measurement module estimates the amplitude and phase of the coupling and an envelope delay between a signal output by the aggressor transmit chain and the coupling. In those embodiments, an isolation pre-compensation module generates the pre-compensation signal based on the estimated amplitude of the coupling, the estimated phase of the coupling, the envelope delay between the signal output by the aggressor transmit chain and the coupling, and the difference between the carrier frequencies of the aggressor and victim transmit chains.

Because the amplitude of the coupling may be dependent on the gain settings of attenuators in both the aggressor transmit chain and the victim transmit chain, which may vary during mission mode operation, in some embodiments the signal measurement module estimates a relationship between the amplitude of the coupling and the gain settings of the attenuators. In those embodiments, the system may monitor the gain settings of the attenuators and adjust the amplitude of the pre-compensation signal in response to any change in the gain setting of either attenuator.

Because the phase of the coupling may be dependent on the difference in carrier frequencies of the aggressor and victim transmit chains, which may change during mission mode operation, in some embodiments the signal measurement module estimates a relationship between the phase of the coupling and differences in the carrier frequencies of the aggressor and victim transmit chains. In those embodiments, the system may monitor the carrier frequencies of the aggressor and victim transmit chain and adjust the pre-compensation signal in response to any change in carrier frequency.

BRIEF DESCRIPTION OF THE DRAWINGS

For a detailed description of various examples, reference will now be made to the accompanying drawings in which.

The same reference numbers and other reference designators are used in the drawings to designate the same or similar (functionally and/or structurally) features.

DETAILED DESCRIPTION

Figure 1:
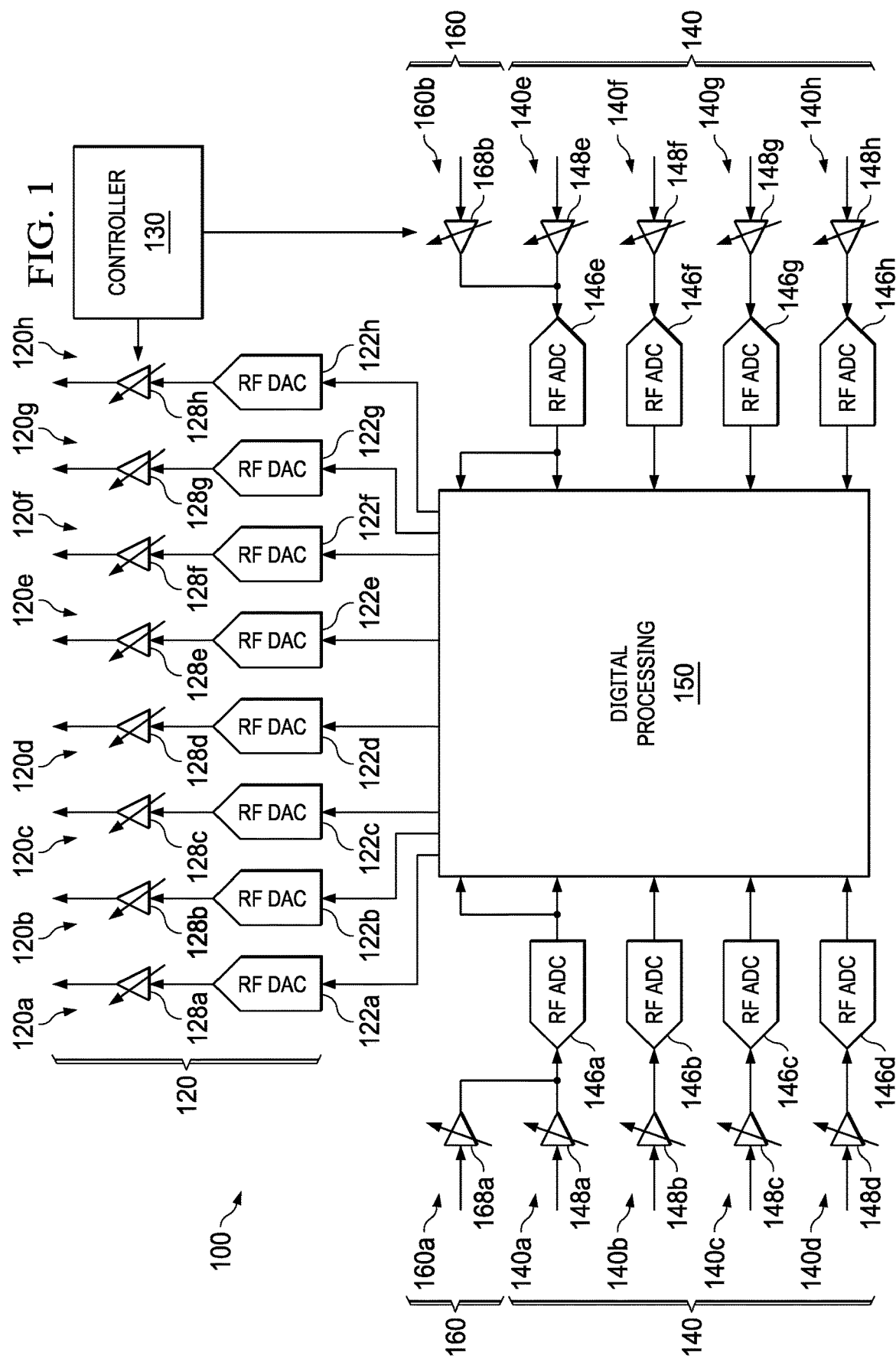
FIG. 1 is a block diagram illustrating an example radio frequency (RF) base station according to an illustrated embodiment.

FIG. 1 is a diagram illustrating a radio frequency (RF) base station 100 according to an illustrative embodiment. The base station 100 may include a number of digital transmit chains 120 (also referred to as channels) and a number of digital receive chains 140 (also referred to as channels), each coupled to digital processing 150. Additionally, the base station 100 may include a number of feedback chains 160 (also referred to as feedback paths) that are used to measure the performance of the transmit chains 120. The base station 100 also includes a controller 130 that controls the operation of the transmit chains 120, the receive chains 140, and the feedback chains 160 as described below.

In the embodiment of FIG. 1, the base station 100 includes eight transmit chains 120a through 120h, eight receive chains 140a through 140h, and two feedback chains 160a and 160b. However, a base station 100 may include any number of transmit chains 120, receive chains 140, and/or feedback chains 160. As described above, for example, a massive MIO base station 100 may have as many as 64 transmit chains 120 and 64 receive chains 140.

In the embodiment of FIG. 1, each transmit chain 120 includes an RF sampling digital-to-analog converter (RF DAC) 122, which converts the digital signals received from the digital processing 150 to analog signals that can be transmitted via an antenna, and a digital step attenuator (DSA) 128, an attenuator with a variable gain that can be adjusted as needed to account for varying conditions (e.g., temperature) of the base station 100. In the embodiment of FIG. 1, each receive chain 140 includes a digital step attenuator (DSA) 148, which amplifies or attenuates the receive signals by a selectable amount, and an RF sampling analog-to-digital converter (RF ADC) 146, which converts the analog receive signals to digital for processing by the digital processing 150. Each feedback chain 160 includes a DSA 168, which amplifies or attenuates the signals output by the transmit chain 120 being measured, and an RF sampling ADC, which converts those analog signals output by that transmit chain 120 to digital signals. In some embodiments, such as the embodiment of FIG. 1, each feedback path 160 may share an RF DAC 146 with one of the receive chains 140.

In the specific embodiment of FIG. 1, the transmit chain 120a includes an RF DAC 122a and a DSA 128a, the transmit chain 120b includes an RF DAC 122b and a DSA 128b, the transmit chain 120c includes an RF DAC 122c and a DSA 128c, the transmit chain 120d includes an RF DAC 122d and a DSA 128d, the transmit chain 120e includes an RF DAC 122e and a DSA 128e, the transmit chain 120f includes an RF DAC 122f and a DSA 128f, the transmit chain 120g includes an RF DAC 122g and a DSA 128g, the transmit chain 120h includes an RF DAC 122h and a DSA 128h, the receive chain 140a includes a DSA 148a and an RF ADC 146a, the receive chain 140b includes a DSA 148b and an RF ADC 146b, the receive chain 140c includes a DSA 148c and an RF ADC 146c, the receive chain 140d includes a DSA 148d and an RF ADC 146d, the receive chain 140e includes a DSA 148e and an RF ADC 146e, the receive chain 140f includes a DSA 148f and an RF ADC 146f, the receive chain 140g includes a DSA 148g and an RF ADC 146g, and the receive chain 140h includes a DSA 148h and an RF ADC 146h, the feedback chain 160a includes a DSA 160a and the RF ADC 146a of receive chain 140a, and the feedback chain 160b includes a DSA 160b and the RF ADC 146e of receive chain 140e.

During system configuration, the controller 130 receives information specifying the desired configuration of one of more of the transmit chains 120 (typically specified by a customer using the base station 100 to transmit information). The desired configuration of a transmit chain 120 may include, for example, a carrier frequency, a band, an interface rate, a digital-to-analog conversion rate, etc. The controller 130 is coupled to the components necessary to configure each transmit chain 120 of the base station 100 and configures each transmit chain 120 to perform as specified. The controller 130 also determines, based on the current conditions (e.g., temperature) of the base station 100, the gain setting required for each DSA 128 and 148 to amplify or attenuate the signals of each respective chain 120, 140, or 160 and controls each DSA 128 and 148 to amplify or attenuate the respective signals using the determined gain setting for the respective chain 120, 140, or 160. During mission mode operation, the controller 130 may reconfigure one or more of the transmit chains 120 as needed. For example, the controller 130 may adjust a carrier frequency of one or more transmit chains 120. In some embodiments, as the conditions (e.g., temperature) of the base station 100 changes, the controller 130 may determine an updated gain setting required for a DSA 128 or 148 to amplify or attenuate signals of that chain 120, 140, or 160 in the updated conditions and adjust the gain setting of one or more of the DSAs 128 or 148. In other embodiments, the gain settings of each DSA 128 or 148 may be adjusted during mission mode operation by an autonomous automatic gain controller, which may be internal to or external to the base station 100. In those embodiments, the controller 130 receives an interrupt indicating that a gain setting of a DSAs 128 and 148 has changed.

The controller 130 may be any hardware computing device capable of performing the functions described herein. The controller 130 may be, for example, a microcontroller, a microprocessor, an application-specific integrated circuit (ASIC), a hardware state machine, etc. The controller 130 includes a hardware computation unit that calculates pre-compensation variables (described below) and non-transitory storage media for storing those pre-compensation variables.

Figure 2:
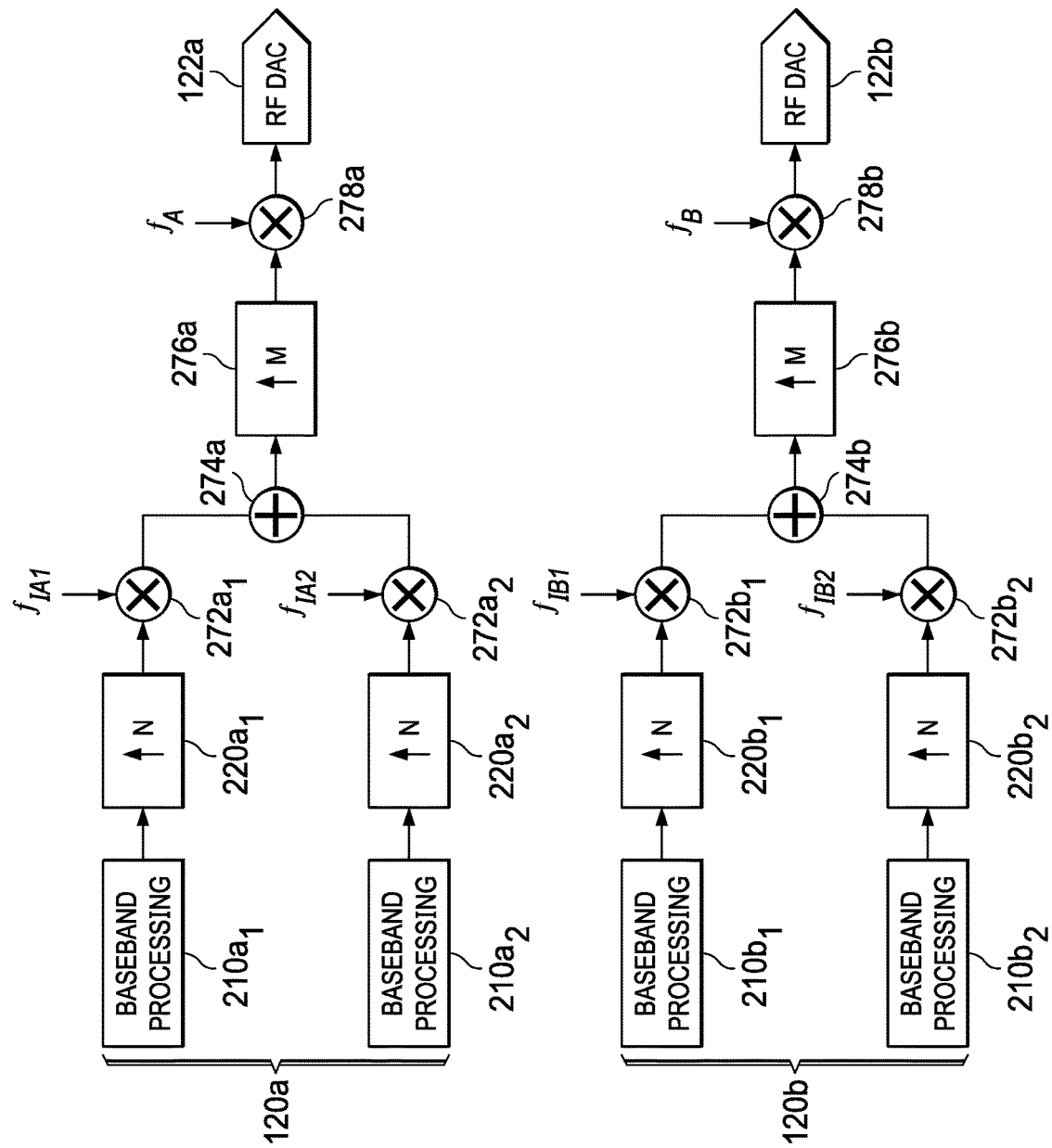
FIG. 2 is a block diagram illustrating example digital transmit chains.

FIG. 2 is a diagram illustrating example digital transmit chains 120a and 120b (collectively, transmit chains 120). As described above with reference to FIG. 1, in some embodiments the transmit chain 120a includes an RF DAC 122a and the transmit chain 120b includes an RF DAC 122b. In the embodiment of FIG. 2, each transmit chain 120a and 120b is a dual band transmit chain 120 with baseband processing 210 for each band, each coupled to an interpolate-by-N filter 220 for that band, which are each coupled to a fine mixer 272 for that band, which are each coupled to an adder 274, which is coupled to an interpolate-by-M filter 276, which is coupled to a coarse mixer 278, which is coupled to the RF DAC 122.

Each baseband processing 210 outputs data at an interface rate. Interface rates in 5G systems are typically 245.76 megasamples per second (MSPS) or 491.52 MSPS. Each transmit chain 120 up-samples the data received from the baseband processing 210 at the interface rate to the sampling rate of the RF DAC 122. The sampling rates of RF DACs 122 are typically 8847.36 MSPS or 11,796.48 MSPS. Each transmit chain 120 also frequency up-converts the data received from the baseband processing 210 to a local oscillator (LO) carrier frequency. 5G frequency bands are typically 3.4-3.8 gigahertz (GHz) or 2.4-2.6 GHz. LO carrier frequencies are typically chosen in that frequency range.

The example transmit chains 120 shown in FIG. 2 are each dual band systems that perform frequency mixing in two stages. Two interpolate-by-N filters 220 each up-sample data received from a baseband processing 210 by a factor of N. Two fine mixers 272 each up-convert the interpolated signal in each band to an intermediate frequency. The adder 274 combines the interpolated and up-converted signals in each band. The interpolate-by-M filter 276 up-samples the combined, fine mixed signal by a factor of M. And the coarse mixer 278 converts the fine mixed and interpolated signal to the required LO frequency. (The disclosed system is applicable to other embodiments, however, for example wherein both of the mixers 272 and 278 are fine mixers.)

In the specific embodiment of FIG. 2, the transmit chain 120a includes baseband processing $210a_1$ for a first band and baseband processing $210a_2$ for a second band. The baseband processing $210a_1$ for the first band is coupled to an interpolate-by-N filter $220a_1$, which up-samples the data received from the baseband processing $210a_1$ by a factor of N. The interpolate-by-N filter $220a_1$ is coupled to a fine mixer $272a_1$, which up-converts the frequency of the signals output by the interpolate-by-N filter $220a_1$ by an intermediate frequency $f_{IA1}$ of the first band of the transmit chain $120a$. Similarly, the baseband processing $210a_2$ for the second band is coupled to an interpolate-by-N filter $220a_2$, which up-samples the data received from the baseband processing $210a_2$ by a factor of N. The interpolate-by-N filter $220a_2$ is coupled to a fine mixer $272a_2$, which up-converts the frequency of the signals output by the interpolate-by-N filter $220a_2$ by an intermediate frequency $f_{IA2}$ of the second band of the transmit chain $120a$. The transmit chain $120a$ also includes an adder $274a$, which has two inputs each coupled to one of the fine mixers $272a_1$ and $272a_2$. The adder $274a$ combines the signals output by the fine mixers $272a_1$ and $272a_2$ in each band. The adder $274a$ is coupled to an interpolate-by-M filter $276a$, which up-samples signals output by the interpolate-by-M filter $276a$ by a factor of M. The interpolate-by-M filter $276a$ is coupled to a coarse mixer $278a$, which up-converts the signal output by the interpolate-by-M filter $276a$ by the carrier frequency $f_A$ of the transmit chain $120a$. The coarse mixer $278a$ is coupled to the RF DAC $122a$, which converts the digital signals output by the coarse mixer $278a$ to analog signals.

The transmit chain $120b$ includes baseband processing $210b_1$ for a first band and baseband processing $210b_2$ for a second band. The baseband processing $210b_1$ for the first band is coupled to an interpolate-by-N filter $220b_1$, which up-samples the data output by the baseband processing $210b_1$ by a factor of N. The interpolate-by-N filter $220b_1$ is coupled to a fine mixer $272b_1$, which up-converts the frequency of the signals output by the interpolate-by-N filter $220b_1$ by an intermediate frequency $f_{IB1}$ of the first band of the transmit chain $120b$. Similarly, the baseband processing $210b_2$ for the second band is coupled to an interpolate-by-N filter $200b_2$, which up-samples the data output by the baseband processing $210b_2$ by a factor of N. The interpolate-by-N filter $200b_2$ is coupled to a fine mixer $272b_2$, which up-converts the frequency of the signals output by the interpolate-by-N filter $200b_2$ by the intermediate frequency $f_{IB2}$ of the second band of the transmit chain $120b$. The transmit chain $120b$ also includes an adder $274b$, which has two inputs each coupled to one of the fine mixers $272b_1$ and $272b_2$. The adder $274b$ combines the signals output by the fine mixers $272b_1$ and $272b_2$ in each band. The adder $274b$ is coupled to an interpolate-by-M filter $276b$, which up-samples the signals output by the adder $274b$ by a factor of M. The interpolate-by-M filter $276b$ is coupled to a coarse mixer $278b$, which up-converts the signals output by the interpolate-by-M filter $276b$ by the carrier frequency $f_B$ of the transmit chain $120b$. The coarse mixer $278b$ is coupled to the RF DAC $122b$, which converts the digital signals output by the coarse mixer $278b$ to analog signals.

Because of the close spacing between the transmit chains $120$, each transmit chain $120$ may cause unwanted coupling in another transmit chain $120$ having an amplitude $\alpha$ and phase $\phi$. Also, there is an envelope delay $\tau$ between the time when an aggressor transmit chain $120$ outputs a signal and the time when that signal interferes with a nearby transmit chain $120$ (a "victim" transmit chain $120$). Accordingly, as described below with reference to FIGS. 7-9, the TX-TX pre-compensation system of some example embodiments (such as TX-TX pre-compensation system $300$) estimates the amplitude $\alpha$ and phase $\phi$ of the coupling as well as the envelope delay $\tau$ between the time when an "aggressor" transmit chain $120$ outputs a signal and the time of the coupling. As described below with reference to FIGS. 3-6, in some embodiments the TX-TX pre-compensation system $300$ injects a pre-compensation signal into each transmit chain $120$ to pre-compensate for the coupling. The pre-compensation signal has an amplitude $\alpha$ with a magnitude that is equal to the estimated amplitude $\alpha$ of the coupling and a phase $\hbar+\pi$ to cancel the coupling having an estimated phase $\phi$. The envelope of the pre-compensation signal is delayed by the estimated envelope delay $\tau$ of the coupling. Because the coupling is a sine wave with an estimated phase $\phi$ (and an estimated amplitude $\alpha$ and estimated envelope delay $\tau$), the instantaneous amplitude of a pre-compensation signal with a phase $\phi$ shifted by $\pi$ (180 degrees) (and an amplitude $\alpha$ and an envelope delay $\tau$) should always be equal and opposite the instantaneous amplitude of the estimated coupling. That same pre-compensation signal (having an amplitude $\alpha$ and $\alpha$ phase $\phi+\pi$) can also be described as having an amplitude $-\alpha$ and a phase $\phi$. Accordingly, the pre-compensation signal cancels out the estimated coupling.

Figure 3:
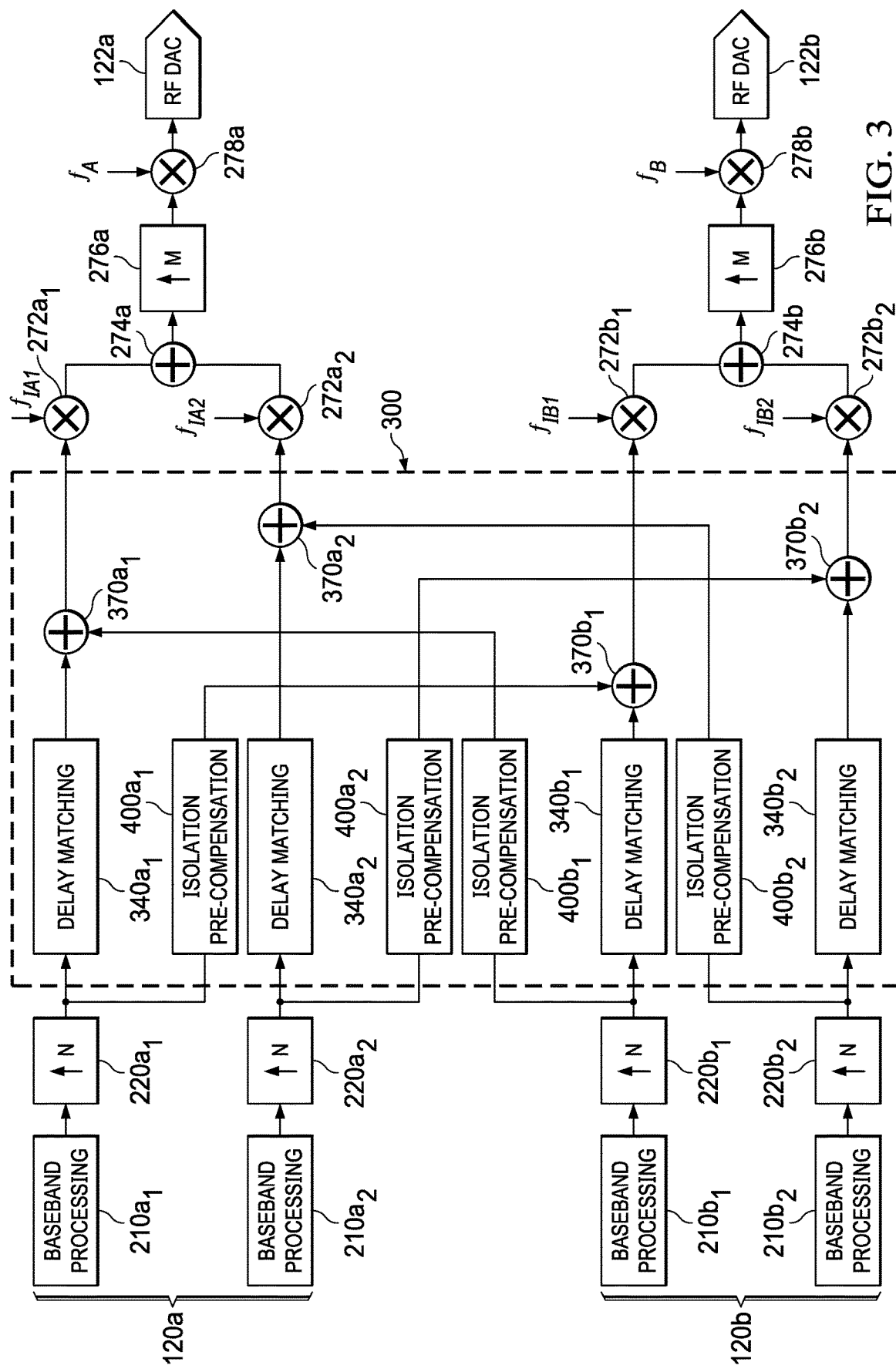
FIG. 3 is a block diagram illustrating a TX-TX pre-compensation system according to an illustrative embodiment.

FIG. 3 is a diagram illustrating the TX-TX pre-compensation system $300$ according to an illustrative embodiment. As described above with reference to FIG. 1, in some embodiments the transmit chain $120a$ includes an RF DAC $122a$ and the transmit chain $120b$ includes an RF DAC $122b$. As described above with reference to FIG. 2, in some embodiment the transmit chain $120a$ includes baseband processing $210a_1$, an interpolate-by-N filter $220a_1$, and a fine mixer $272a_1$ for the first band; baseband processing $210a_2$, an interpolate-by-N filter $220a_2$, and a fine mixer $272a_2$ for the second band; an adder $274a$, an interpolate-by-M filter $276a$, and a coarse mixer $278a$. In some of those embodiments, the transmit chain $120b$ includes baseband processing $210b_1$, an interpolate-by-N filter $220b_1$, and a fine mixer $272b_1$ for the first band; baseband processing $210b_2$, an interpolate-by-N filter $200b_2$, and a fine mixer $272b_2$ for the second band; an adder $274b$, an interpolate-by-M filter $276b$, and a coarse mixer $278b$. In those embodiments, the interpolate-by-N filter $220a_1$ up-samples the data in the first band of the transmit chain $120a$ received from the baseband processing $210a_1$ by a factor of N, the fine mixer $272a_1$ up-converts the frequency of the signals output by the interpolate-by-N filter $220a_1$ by the intermediate frequency $f_{IA1}$ of the first band of the transmit chain $120a$, the interpolate-by-N filter $220a_2$ up-samples data received from the baseband processing $210a_2$ by a factor of N, the fine mixer $272a_2$ up-converts the frequency of the signals in the second band of the transmit chain $120a$ output by the interpolate-by-N filter $220a_2$ by the intermediate frequency $f_{IA2}$ of the second band of the transmit chain $120a$, the adder $274a$ combines the signals output by the fine mixers $272a_1$ and $272a_2$ in each band, the interpolate-by-M filter $276a$ up-samples signals the signals output by the interpolate-by-M filter $276a$ by a factor of M, the coarse mixer $278a$ up-converts the signals output by the interpolate-by-M filter $276a$ by the carrier frequency $f_A$ of the transmit chain $120a$, and the RF DAC $122a$ converts the digital signals output by the coarse mixer $278a$ to analog signals. Similarly, the interpolate-by-N filter $220b_1$ up-samples the data in the first band of the transmit chain $120b$ received from the baseband processing $210b_1$ by a factor of N, the fine mixer $272b_1$ up-converts the frequency of the signals output by the interpolate-by-N filter $220b_1$ by the intermediate frequency $f_{IB1}$ of the first band of the transmit chain $120b$, the interpolate-by-N filter $200b_2$ up-samples data received from the baseband processing $210b_2$ by a factor of N, the fine mixer $272b_2$ up-converts the frequency of the signals output by the interpolate-by-N filter $200b_2$ by the intermediate frequency $f_{IB2}$ of the second band of the transmit chain $120b$, the adder $274b$ combines the signals output by the fine mixers $272b_1$ and $272b_2$ in each band, the interpolate-by-M filter $276b$ up-samples signals the signals output by the interpolate-by-M filter $276b$ by a factor of M, the coarse mixer $278b$ up-converts the signals output by the interpolate-by-M filter $276b$ by the carrier frequency $f_B$ of the transmit chain $120b$, and the RF DAC $122b$ converts the digital signals output by the coarse mixer $278b$ to analog signals.

In the embodiment of FIG. 3, for each band of each transmit chain 120, the TX-TX pre-compensation system 300 includes an isolation pre-compensation module 400, a delay matching module 340, and an adder 370. As described in detail below with reference to FIGS. 4-6, each isolation pre-compensation module 400 in each band of each transmit chain 120 outputs a pre-compensation signal to an adder 370 of another transmit chain 120 to pre-compensate for the coupling in the other transmit chain 120 caused by the signal transmitted by that transmit chain 120 in that band. In some embodiments, each isolation pre-compensation module 400 is controlled by the controller 130 to output a pre-compensation signal having an amplitude $\alpha$ and a phase $\phi+\pi$ determined by the controller 130 (as described below with reference to FIGS. 7-8). Additionally, each delay matching module 340 in each band delays the signal output by that transmit chain 120 in that band by the same number of processing cycles used by the isolation pre-compensation module 400 in that band of that transmit chain 120 to generate the pre-compensation signal output to the other transmit chain 120. Therefore, the timing of the signal output by that transmit chain 120 in that band matches the timing of the pre-compensation signal (output to another transmit chain 120) that pre-compensates for the coupling caused by the signal transmitted by that transmit chain 120 in that band. Otherwise, the pre-compensation signal output by the isolation pre-compensation module 400 in each band would be delayed, relative to the signal output by that transmit chain 120 in that band, and would not properly cancel out the coupling caused by the signal transmitted by that transmit chain 120 in that band. In some embodiments, each delay matching module 340 is controlled by the controller 130 to delay the signal output by that band of that transmit chain 120 by an envelope delay $\tau$ determined by the controller 130 (as described below with reference to FIGS. 7-8).

In the specific embodiment of FIG. 3, the first band of the transmit chain $120a$ includes an isolation pre-compensation module $400a_1$, a delay matching module $340a_1$, and an adder $370a_1$; the second band of the transmit chain $120a$ includes an isolation pre-compensation module $400a_2$, a delay matching module $340a_2$, and an adder $370a_2$; the first band of the transmit chain $120b$ includes an isolation pre-compensation module $400b_1$, a delay matching module $340b_1$, and an adder $370b_1$; and the second band of the transmit chain $120b$ includes an isolation pre-compensation module $400b_2$, a delay matching module $340b_2$, and an adder $370b_2$.

In the first band of the transmit chain $120a$, the isolation pre-compensation module $400a_1$ generates a pre-compensation signal to pre-compensate for coupling in the transmit chain $120b$ caused by the first band of the transmit chain $120a$. The isolation pre-compensation module $400a_1$ outputs that pre-compensation signal to the adder $370b_1$ of the first band of the transmit chain $120b$, which adds that pre-compensation signal to the first band signal of the transmit chain $120b$ to pre-compensate for the coupling in the transmit chain $120b$ caused by the first band of the transmit chain $120a$. (Because the pre-compensation signal can be added to any band or any stage of the transmit chain $120b$, in other embodiments the isolation pre-compensation module $400a_1$ may be coupled to the adder $370b_2$ of the second band of the transmit chain $120b$.) To ensure that the timing of the signal output by the transmit chain $120a$ in the first band matches the timing of the pre-compensation signal output by isolation pre-compensation module $400a_1$, the delay matching module $340a_1$ delays the signal output by the transmit chain $120a$ in the first band by the same number of processing cycles used by the isolation pre-compensation module $400a_1$ to generate the pre-compensation signal for the transmit chain $120b$.

In the second band of the transmit chain $120a$, the isolation pre-compensation module $400a_2$ generates a pre-compensation signal to pre-compensate for coupling in the transmit chain $120b$ caused by the second band of the transmit chain $120a$. The isolation pre-compensation module $400a_2$ outputs that pre-compensation signal to the adder $370b_2$ of the second band of the transmit chain $120b$, which adds that pre-compensation signal to the second band signal of the transmit chain $120b$ to pre-compensate for the coupling in the transmit chain $120b$ caused by the second band of the transmit chain $120a$. (Because the pre-compensation signal can be added to any band or any stage of the transmit chain $120b$, in other embodiments the isolation pre-compensation module $400a_2$ may be coupled to the adder $370b_1$ of the first band of the transmit chain $120b$.) To ensure that the timing of the signal output by the transmit chain $120a$ in the second band matches the timing of the pre-compensation signal output by isolation pre-compensation module $400a_2$, the delay matching module $340a_2$ delays the signal output by the transmit chain $120a$ in the second band by the same number of processing cycles used by the isolation pre-compensation module $400a_2$ to generate the pre-compensation signal for the transmit chain $120b$.

In the first band of the transmit chain $120b$, the isolation pre-compensation module $400b_1$ generates a pre-compensation signal to pre-compensate for coupling in the transmit chain $120a$ caused by the first band of the transmit chain $120b$. The isolation pre-compensation module $400b_1$ outputs that pre-compensation signal to the adder $370a_1$ of the first band of the transmit chain $120a$, which adds that pre-compensation signal to the first band signal of the transmit chain $120a$ to pre-compensate for the coupling in the transmit chain $120a$ caused by the first band of the transmit chain $120b$. (Because the pre-compensation signal can be added to any band or any stage of the transmit chain $120a$, in other embodiments the isolation pre-compensation module $400b_1$ may be coupled to the adder $370a_2$ of the second band of the transmit chain $120a$.) To ensure that the timing of the signal output by the transmit chain $120b$ in the first band matches the timing of the pre-compensation signal output by isolation pre-compensation module $400b_1$, the delay matching module $340b_1$ delays the signal output by the transmit chain $120b$ in the first band by the same number of processing cycles used by the isolation pre-compensation module $400b_1$ to generate the pre-compensation signal for the transmit chain $120a$.

In the second band of the transmit chain $120b$, the isolation pre-compensation module $400b_2$ generates a pre-compensation signal to pre-compensate for coupling in the transmit chain $120a$ caused by the second band of the transmit chain $120b$. The isolation pre-compensation module $400b_2$ outputs that pre-compensation signal to the adder $370a_2$ of the first band of the transmit chain $120a$, which adds that pre-compensation signal to the second band signal of the transmit chain 120a to pre-compensate for the coupling in the transmit chain 120a caused by the second band of the transmit chain 120b. (Because the pre-compensation signal can be added to any band or any stage of the transmit chain 120b, in other embodiments the isolation pre-compensation module 400$b_2$ may be coupled to the adder 370$a_1$ of the first band of the transmit chain 120a.) To ensure that the timing of the signal output by the transmit chain 120b in the second band matches the timing of the pre-compensation signal output by isolation pre-compensation module 400$b_2$, the delay matching module 340$b_2$ delays the signal output by the transmit chain 120b in the second band by the same number of processing cycles used by the isolation pre-compensation module 400$b_2$ to generate the pre-compensation signal for the transmit chain 120a.

Figure 4:
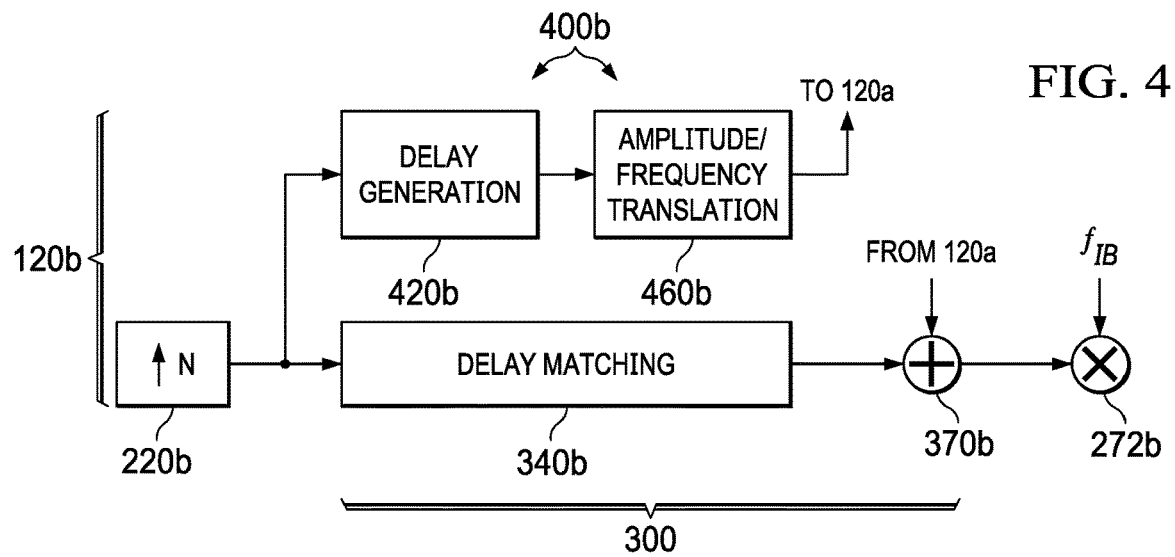
FIG. 4 is a block diagram illustrating the TX-TX pre-compensation system as applied to a single band of a single transmit chain according to an illustrative embodiment.

FIG. 4 is a diagram illustrating the TX-TX pre-compensation system 300 as applied to a single band of transmit chain 120b according to an illustrative embodiment. This embodiment of TX-TX pre-compensation system 300 is for pre-compensating for coupling in a victim transmit band 120a caused by an aggressor transmit band. This embodiment of TX-TX pre-compensation system 300 is applicable to an embodiment for any band of any aggressor transmit chain 120 and any victim transmit chain 120, for example as shown in FIG. 3. As described above with reference to FIG. 2, in some embodiments a band of the transmit chain 120b includes an interpolate-by-N filter 120b that up-samples data in that band and a fine mixer 272b that up-converts the frequency of those signals to the intermediate frequency $f_{IB}$ of that band. As described above with reference to FIG. 3, in some embodiments, for each band of each transmit chain 120, the TX-TX pre-compensation system 300 includes a delay matching module 340, an isolation pre-compensation module 400, and an adder 370.

In the embodiment of FIG. 4, the isolation pre-compensation module 400b for a band of the transmit chain 120b includes a delay generation module 420b and an amplitude and frequency translation module 460b. As described in detail below, the delay generation module 420b and the amplitude and frequency translation module 460b generate the pre-compensation signal that is output to the transmit chain 120a to pre-compensate for the interference caused by the illustrated band of the transmit chain 120b. The adder 370b of the illustrated band of the transmit chain 120b receives a pre-compensation signal from the transmit chain 120a, which is output by an amplitude and frequency translation module (not shown) of the transmit chain 120a to pre-compensate for the interference/coupling caused by the transmit chain 120a to the transmit chain 120b. Since the delay generation module 420b and the amplitude and frequency translation module 460b take one or more processing cycles to generate the pre-compensation signal output from the illustrated band of the transmit chain 120b, the delay matching module 340b (for the illustrated band of the transmit chain 120b) delays the signal output by the transmit chain 120b in the illustrated band by the same number of processing cycles so that the timing of the signal output by the transmit chain 120b in the illustrated band matches the timing of the pre-compensation signal that compensates for the coupling caused by the signal transmitted by the transmit chain 120b in the illustrated band.

Figure 5:
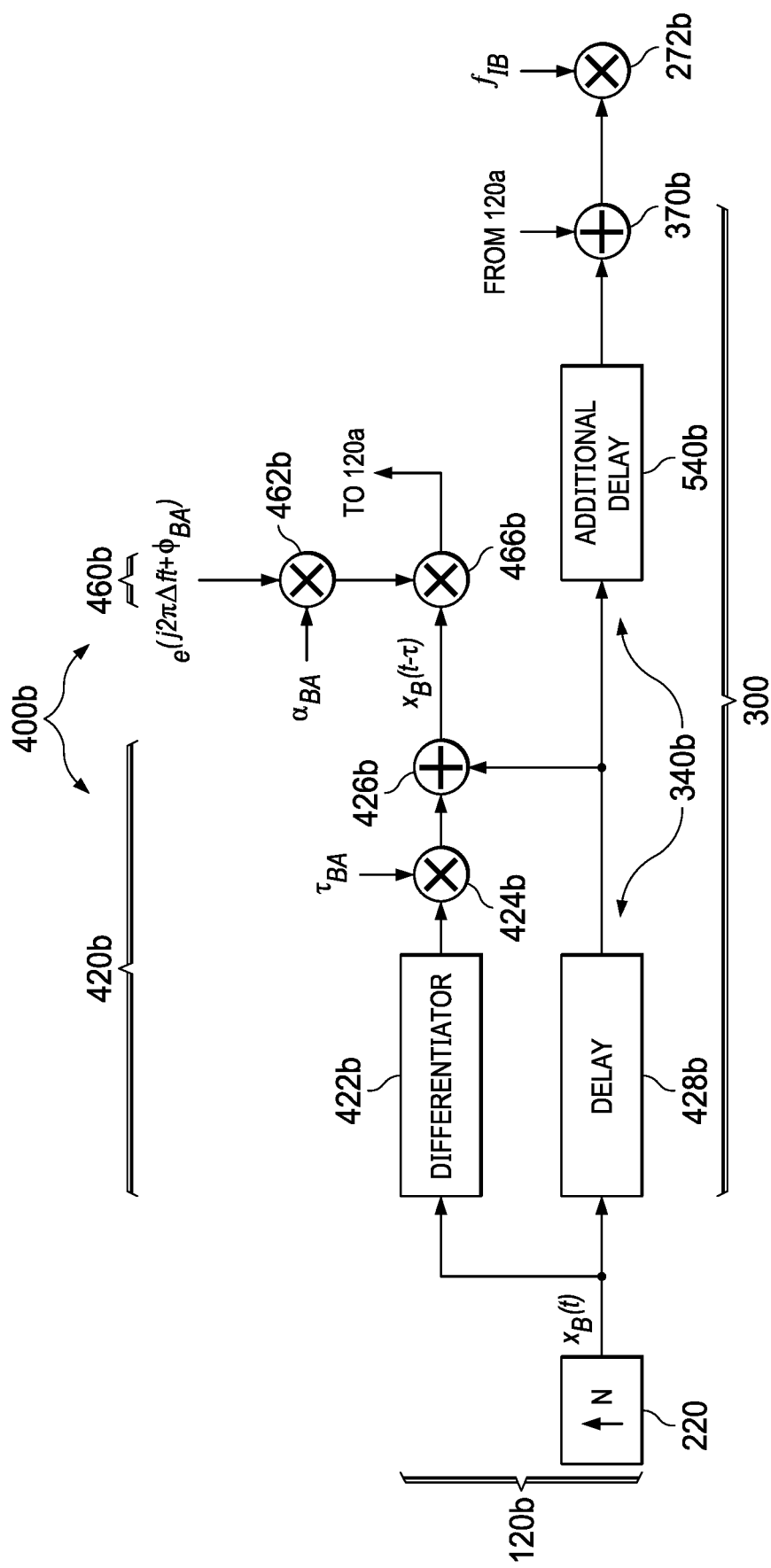
FIG. 5 is a block diagram illustrating the TX-TX pre-compensation system in greater detail according to an illustrative embodiment.

FIG. 5 is a diagram illustrating a portion of the TX-TX pre-compensation system 300 (for a single band of the transmit chain 120b) in greater detail according to an illustrative embodiment. This embodiment of TX-TX pre-compensation system 300 is for pre-compensating for coupling in a victim transmit band 120a caused by an aggressor transmit band 120b. This embodiment is applicable to an embodiment for any band of any aggressor transmit chain 120 and any victim transmit chain 120. As described above with reference to FIG. 2, in some embodiments each band of the transmit chain 120b includes an interpolate-by-N filter 120b that up-samples data in that band and a fine mixer 272b that up-converts the frequency of those signals to the intermediate frequency $f_{IB}$ of that band. As described above with reference to FIG. 3, in some embodiments, for each band of each transmit chain 120, the TX-TX pre-compensation system 300 includes a delay matching module 340, an isolation pre-compensation module 400, and an adder 370. As described above with reference to FIG. 4, in some embodiments the isolation pre-compensation module 400b includes a delay generation module 420b and an amplitude and frequency translation module 460b.

In the embodiment of FIG. 5, the delay generation module 420b of the illustrated band of the transmit chain 120b includes a differentiator 422b, a multiplier 424b, an adder 426b, and a delay circuit 428b; the amplitude and frequency translation module 460b of the illustrated band of the transmit chain 120b includes a first mixer 462b and a second mixer 466b; and the delay matching module 340b of the illustrated band of the transmit chain 120b includes the delay circuit 428b of the delay generation module 420b and an additional delay circuit 540b. In some embodiments, the isolation pre-compensation module 400b generates and outputs the pre-compensation signal to the transmit chain 120a in response to control signals received from the controller 130.

As shown in FIG. 5, the interpolate-by-N filter 120b outputs a signal $x_B(t)$, which is the envelope of the RF signal output by the transmit chain 120b in the illustrated band. The delay generation module 420b ensures that the envelope of the pre-compensation signal output to the transmit chain 120a by the isolation pre-compensation module 400b of the transmit chain 120b is delayed by the estimated envelope delay τ of the coupling in the transmit chain 120b caused by the illustrated band the transmit chain 120b (determined, for example, by the controller 130 as described below with reference to FIG. 7). The delay generation module 420b generates a signal $x_B(t-\tau)$ where τ is the envelope delay between when a transmit chain 120b emits a signal in the illustrated band and when that signal interferes with the transmit chain 120a. Performing a Taylor Series expansion yields the following equation 1.

$$x_B(t-\tau) = x_B(t) - \tau * \frac{dx}{dt} \tag{1}$$

Therefore, in the embodiment of FIG. 5, the differentiator 422b generates a derivative $$\frac{dx}{dt}$$

of the input signal $x_B(t)$, the multiplier 424b multiplies the derivative $$\frac{dx}{dt}$$

with the envelope delay τ, and the adder 426b subtracts the product $$\frac{dx}{dt} * \tau$$

from the original input signal $x_B(t)$. The delay circuit 428b introduces the same delay in the original input signal $x_B(t)$ as the differentiator 422b and the multiplier 424b.

The amplitude and frequency translation module 460b ensures that the pre-compensation signal output to the transmit chain 120a by the isolation pre-compensation module 400b has the same amplitude α and frequency of the coupling in the transmit chain 120a caused by the illustrated band of the transmit chain 120b (determined, for example, by the controller 130 as described below with reference to FIGS. 7-8). In the embodiment of FIG. 5, the first mixer 462b mixes $\alpha_{BA}$ and a frequency shift phasor $e^{(j2\pi\Delta ft+\phi_{BA})}$ is the estimated amplitude of the coupling in the transmit chain 120a caused by the illustrated band of the transmit chain 120b (determined, for example, by the controller 130 as described below with reference to FIGS. 7-8). The frequency shift phasor $e^{(j2\pi\Delta ft+\phi_{BA})}$ is the phase with which the coupling amplitude and the signal are multiplied to get the frequency translated coupling component, where $\Delta f = f_B - f_A$ is the difference between the carrier (LO) frequency $f_B$ of the transmit chain 120b and the carrier (LO) frequency $f_A$ of the transmit chain 120a and $\phi_{BA}$ is the estimated phase of the coupling in the transmit chain 120a caused by the illustrated band of the transmit chain 120b (determined, for example, by the controller 130 as described below with reference to FIG. 7). The second mixer 446b generates the pre-compensation signal for the transmit chain 120a by mixing the product of the mixer 442b with the output of adder 426b (the signal $x_B(t-\tau)$).

As described above, the isolation pre-compensation module 400b of the illustrated band of the transmit chain 120b generates a pre-compensation signal to compensate for coupling in the transmit chain 120a caused by the illustrated band of the transmit chain 120b. That pre-compensation signal is output to the transmit chain 120a to be added to the signal of one of the bands of the transmit chain 120a (e.g., by the adder $370a_1$ as shown in FIG. 3). Because the transmit chain 120a also causes coupling in the transmit chain 120b, the transmit chain 120a also includes a similar isolation pre-compensation module 400a for each band, one of which outputs a pre-compensation signal that is added by the adder 370b of the illustrated band of transmit chain 120b.

In the process of generating the pre-compensation signal, the delay generation module $420a_1$ and the amplitude and frequency translation module $460a_1$ cause a certain amount of delay. To ensure that the timing of the signal $x_B(t)$ output to the fine mixer 272b matches the timing of the pre-compensation signal (output to the transmit chain 120a) that pre-compensates for the coupling caused by that signal $x_B(t)$, the delay matching module 340b introduces the same delay as the delay generation module 420b and the amplitude and frequency translation module 460b. In the embodiment of FIG. 5, the delay generation module 420b includes the delay circuit 428b, which introduces the same delay in the input signal $x_B(t)$ as the differentiator 422b and the multiplier 424b. Therefore, instead of using duplicative hardware to introduce that same delay as the delay circuit 428b, the delay matching module 340b in the embodiment of FIG. 5 also utilizes the delay circuit 428b as well as an additional delay circuit 540b. In the embodiment of FIG. 5, the additional delay circuit 540b is coupled to the output of the delay circuit 428b and introduces the same delay as the adder 426b and the amplitude and frequency translation module 460b so that, together, the delay circuit 428b and the additional delay circuit 360b delay the signal $x_B(t)$ by the same number of processing cycles as the isolation pre-compensation module 400b uses to generate the pre-compensation signal for the transmit chain 120a.

In the embodiments shown in FIGS. 3-5, two transmit chains 120 include a cross-coupled pair of isolation pre-compensation modules 400 between them. However, the TX-TX pre-compensation system 300 is not limited in this regard. Instead, the TX-TX pre-compensation system 300 can be configured to pre-compensate for coupling from and to any number of transmit chains 120. For example, in an 8T8R transceiver with eight transmit chains 120 and eight receive chains 140 (as shown, for example, in FIG. 1), one transmit chain 120 can output pre-compensation signals to all seven of the other transmit chains 120 or any subset of those seven transmit chains 120.

Figure 6:
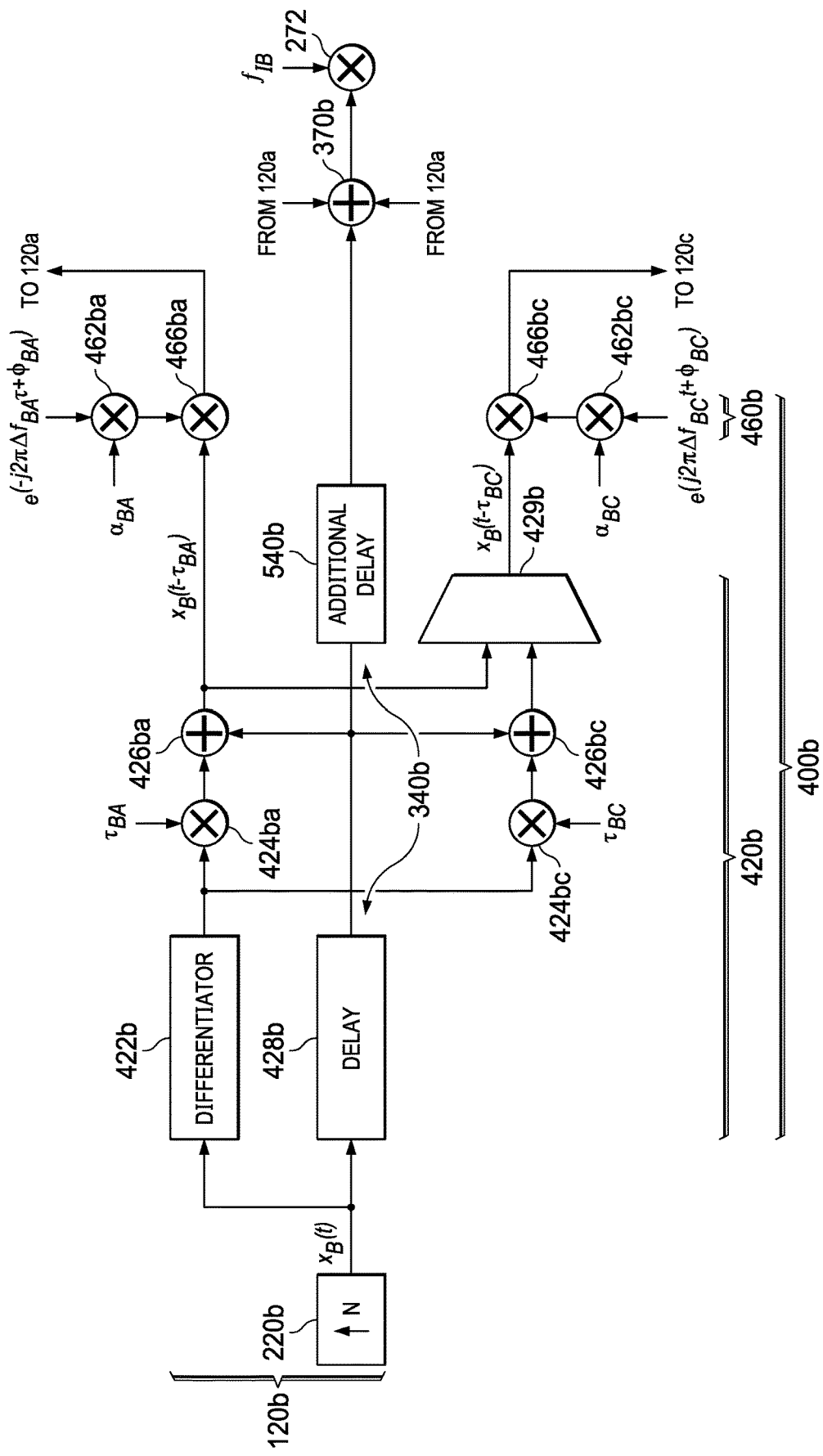
FIG. 6 is a block diagram illustrating a transmit chain with an isolation pre-compensation module that generates two pre-compensation signals for two other transmit chains according to an illustrative embodiment.

FIG. 6 is a diagram illustrating an isolation pre-compensation module 400b for a band of an aggressor transmit chain 120b with that generates two pre-compensation signals for two victim transmit chains 120a and 120c according to an illustrative embodiment. This embodiment is applicable to an embodiment for any band of any aggressor transmit chain 120 and any victim transmit chains 120. As described above with reference to FIG. 2, in some embodiments each band of the transmit chain 120b includes an interpolate-by-N filter 120b that up-samples data in that band and a fine mixer 272b that up-converts the frequency of those signals to the intermediate frequency $f_{IB}$ of that band. As described above with reference to FIGS. 3, in some embodiments the TX-TX pre-compensation system 300 for each band of each transmit chain 120 includes a delay matching module 340, an isolation pre-compensation module 400, and an adder 370. As described above with reference to FIGS. 4, in some embodiments the isolation pre-compensation module 400b includes a delay generation module 420b and an amplitude and frequency translation module 460b. In some embodiments, the isolation pre-compensation module 400b generates and outputs the pre-compensation signal to the transmit chains 120a and 130b in response to control signals received from the controller 130.

In the embodiment of FIG. 6, to generate multiple pre-compensation signals for multiple victim transmit chains 120a and 120c, the delay generation module 420b includes a differentiator 422b, a delay circuit 428b, a multiplier 424ba and an adder 426ba for the first victim transmit chain 120a, and a multiplier 424bc, an adder 426bc and a multiplexer 429b for the second victim transmit chain 120c; and the amplitude and frequency translation module 460b includes a first mixer 462ba and a second mixer 466ba for the first victim transmit chain 120a and a first mixer 462bc and a second mixer 466bc for the second victim transmit chain 120c.

Similar to the embodiment shown in FIG. 5, the isolation pre-compensation module 400b receives a signal $x_B(t)$ from the interpolate-by-N filter 120b and outputs a signal to the fine mixer 272b. In this embodiment, the adder 370b adds pre-compensation signals received from both the transmit chain 120a and the transmit chain 120c.

To generate the pre-compensation signal for the transmit chain 120a, the delay generation module 420b generates a signal $x_B(t-\tau_{BA})$, where $T_{BA}$ is the estimated envelope delay between when the transmit chain 120b emits a signal and when that signal interferes with the transmit chain 120*a* (determined, for example, as described below with reference to FIG. 7). The differentiator 422*b* generates a derivative $$\frac{dx}{dt}$$

of the input signal $x_B(t)$, the mixer 424*ba* mixes the derivative $$\frac{dx}{dt}$$

with the envelope delay $\tau_{BA}$, and the adder 426*ba* subtracts the product $$\frac{dx}{dt} * \tau_{BA}$$

from the original input signal $x_B(t)$, which is delayed by the delay circuit 428*b* by the same delay introduced by the differentiator 422*b* and the mixer 424*ba*. The first mixer 442*ba* mixes an estimated amplitude $\alpha_{BA}$ of the coupling in the transmit chain 120*a* caused by the illustrated band of the transmit chain 120*b* (determined, for example, as described below with reference to FIG. 7) and the phasor$_{BA}$ $e^{(j2\pi \Delta f_{BA} t + \phi_{BA})}$, where $\Delta f_{BA} = f_B - f_A$ is the frequency difference between the carrier (LO) frequency $f_B$ of the transmit chain 120*b* and the carrier (LO) frequency $f_A$ of the transmit chain 120*a* and $\phi_{BA}$ is the phase of the coupling in the transmit chain 120*a* caused by the illustrated band of the transmit chain 120*b* (determined, for example, as described below with reference to FIG. 7). The second mixer 446*ba* generates the pre-compensation signal for the transmit chain 120*a* by mixing the product of the mixer 442*ba* with the signal $x_B(t-\tau_{BA})$ generated by the delay generation module 420*b*.

To generate the pre-compensation signal for the transmit chain 120*c*, the delay generation module 420*b* generates a signal $x_B(t-\tau_{BC})$ where $\tau_{BC}$ is the estimated envelope delay between when a transmit chain 120*b* emits a signal and when that signal interferes with the transmit chain 120*c* (determined, for example, as described below with reference to FIG. 7). The mixer 424*bc* mixes the derivative $$\frac{dx}{dt}$$

generated by the differentiator 422*b* with the envelope delay $\tau_{BC}$, and the adder 426*bc* subtracts the product $$\frac{dx}{dt} * \tau_{BC}$$

from the original input signal $x_B(t)$, which is delayed by the delay circuit 428*b*, and a multiplexer 429 multiplexes the output of the adders 426*ba* and 426*bc* to generate the signal $x_B(t-\tau_{BC})$. The first mixer 442*bc* mixes the amplitude $\alpha_{BC}$ of the coupling in the transmit chain 120*c* caused by the illustrated band of the transmit chain 120*b* (determined, for example, as described below with reference to FIG. 7) and the phasor$_{BC}$ $e^{(j2\pi \Delta f_{BC} t + \phi_{BC})}$, where $\Delta f_{BC} = f_B - f_C$ is the frequency difference between the carrier (LO) frequency $f_B$ of the transmit chain 120*b* and the carrier (LO) frequency $f_C$ of the transmit chain 120*c* and $\phi_{BC}$ is the estimated phase of the coupling in the transmit chain 120*c* caused by the illustrated band of the transmit chain 120*b* (determined, for example, as described below with reference to FIG. 7). The second mixer 446*bc* generates the pre-compensation signal for the transmit chain 120*c* by mixing the product of the mixer 442*bc* with the signal $x_B(t-\tau_{BC})$ generated by the delay generation module 420*b*.

In order to generate the pre-compensation signals described above, the controller 130 is configured to estimate the amplitude $\alpha$, phase $\phi$, and envelope delay $\tau$ of the coupling in a victim transmit chain 120 caused by a band of an aggressor transmit chain 120, for example as described below.

Figure 7:
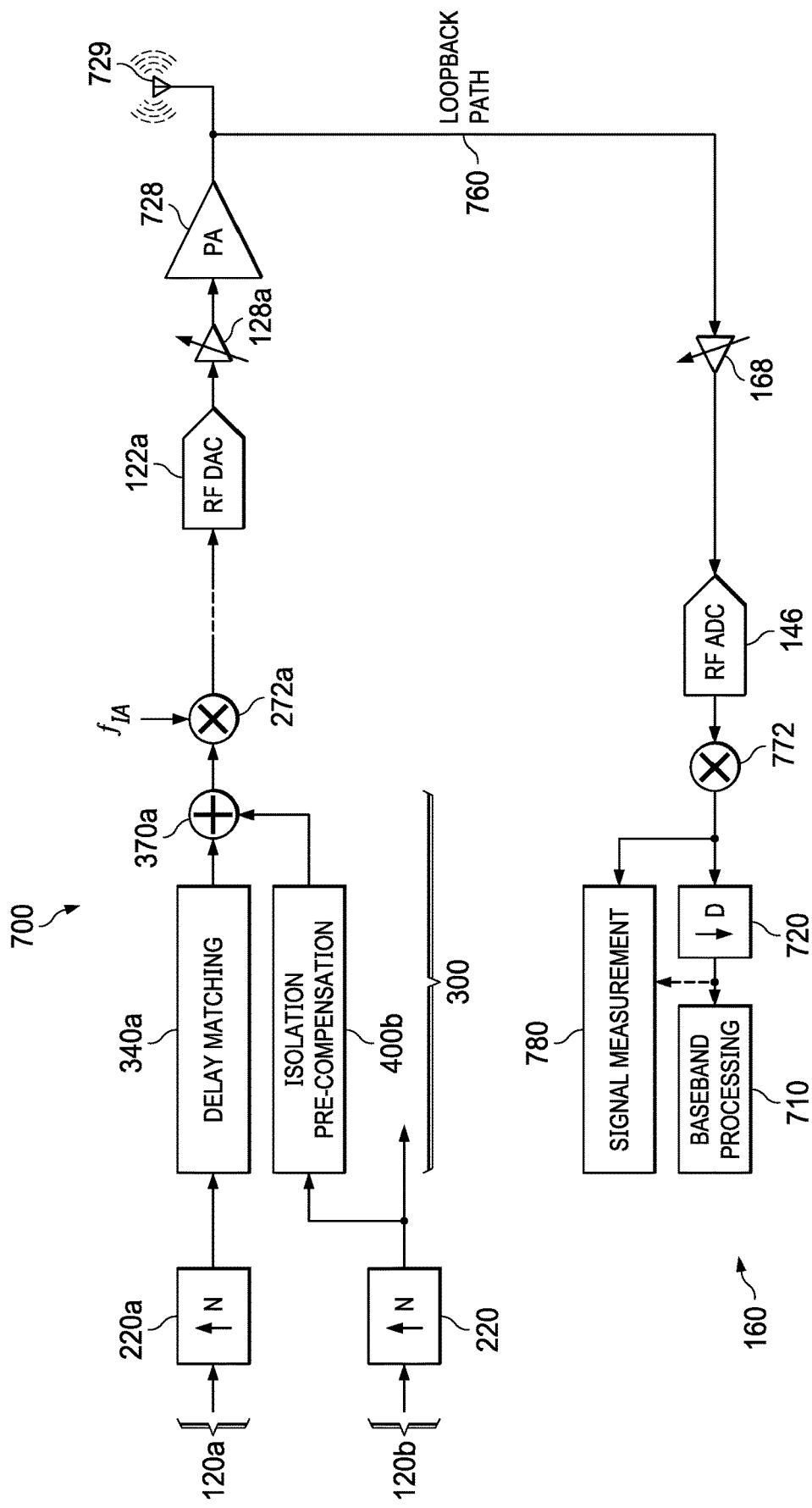
FIG. 7 is a block diagram illustrating a feedback path used by the TX-TX pre-compensation system to estimate the coupling from an aggressor transmit chain to a victim transmit chain according to an illustrative embodiment.

FIG. 7 is a diagram illustrating a feedback path 700 used by the TX-TX pre-compensation system 300 to estimate the coupling from one band of an aggressor transmit chain 120*b* to a victim transmit chain 120*a* according to an illustrative embodiment. This embodiment of feedback path 700 is applicable to an embodiment for any pair of aggressor and victim transmit chains 120. As described above with reference to FIG. 1, in some embodiments each transmit chain 120 includes the RF sampling DAC 122 and a digital step attenuator (DSA) 128 and each feedback chain 160 includes a digital step attenuator (DSA) 168 and an RF sampling ADC 146 (that may be shared with one of the receive chains 140). As described above with reference to FIG. 2, in some embodiments each transmit chain 120 includes an interpolate-by-N filter 220 that up-samples data and a fine mixer 272 that up-converts the frequency of those signals. As described above with reference to FIG. 3, in some embodiments, for each band of each transmit chain 120, the TX-TX pre-compensation system 300 includes a delay matching module 340, an isolation pre-compensation module 400, and an adder 370. In the specific embodiment of FIG. 7, the transmit chain 120*b* includes an interpolate-by-N filter 220*a* and an isolation pre-compensation module 400*b* and the transmit chain 120*a* includes an interpolate-by-N filter 220*a*, a delay matching module 340*a*, an adder 370*a*, a fine mixer 272*a* (that up-converts signals to an intermediate frequency $f_{IA}$), an RF DAC 122*a*, and a DSA 128*a*.

As shown in FIG. 7, each DSA 128 of each transmit chain 120 is typically coupled to a power amplifier 728, which amplifies the analog signal output by the RF DAC 122 for transmission via an antenna 729. The DSA 128 of each transmit chain 120 is a variable gain amplifier. The gain of the power amplifier 728 can vary with the temperature of the base station 100. Therefore, the gain of the DSA 128 is typically adjusted to compensate for variations in the gain of the power amplifier 728.

In a base station 100, a feedback chain 160 is coupled to the output of each transmit chain 120 (typically at the output of the power amplifier 728) via an external loopback path 760. In the embodiment of FIG. 7, the RF ADC 146 of the feedback chain 160 is coupled to a digital mixer (referred to herein as a feedback mixer 772), which is coupled to a decimation chain 720, which is coupled to baseband processing 710.

The DSA 168 of the feedback chain 160 is a variable gain amplifier that amplifies or attenuates the RF signal received via the external loopback path 760. The DSA 168 may have, for example, a 25 decibel (dB) range. The DSA 168 output is connected to the RF ADC 146. The RF ADC 146 converts the analog output of the DSA 168 to the digital signal. The RF ADC 146 may be a high-speed RF-sampling ADC operating at high sampling rates, for example 3 gigasamples per second (GSPS). The ADC 146 output is connected to the feedback mixer 772. The feedback mixer 772 does frequency translation to down-convert the signal from the RF frequency to the baseband frequency. The feedback mixer 772 output is connected to the decimation chain 720, which filters and down-samples the signal from the sampling rate of the RF ADC 146 (e.g., 3 GSPS) to the interface rate (e.g., 245.76 or 491.52 MSPS). The signal at the interface rate is then passed to the baseband processing 710.

The feedback chain 160 includes a signal measurement module 780 that may be used to measure the RF signals output by the transmit chain 120 using any number of methods, including fast Fourier transform (FFT), Goertzel computation, or down-conversion with a mixer followed by a DC offset estimation. In embodiments where the signal measurement module 780 performs DC offset estimation, the measurement module 780 may be coupled to the output of the feedback mixer 772 (shown in FIG. 7 as a solid line). In embodiments where the signal measurement module 780 performs an FFT or Goertzel computation, the signal measurement module 780 may be coupled to the output of the decimation chain 720 (shown in FIG. 7 as a dashed line). The signal measurement module 780 may be an infinite impulse response (IIR) filter. The bandwidth of the IIR may be set according to the required performance. For example, a very low bandwidth IIR can filter out the interference or noise outside the bandwidth to provide estimate of the low frequency signal band.

The signal measurement module 780 may perform signal measurement during the calibration procedure. For example, a continuous wave (CW) of known frequency may transmitted by the aggressor transmit chain 120b and injected into the victim transmit chain 120a, for example using the isolation pre-compensation module 400b. The RF signal output by the power amplifier 728 of the transmit chain 120a is fed to the DSA 168 of the feedback chain 160. The DSA 168 amplifies or attenuates the signal and passes it to the RF ADC 146. The RF ADC 146 samples the analog signal to convert it to a digital signal.

To measure the RF signals output by the transmit chain 120 using DC offset estimation, the feedback mixer 772 down-converts the continuous wave tone output by the RF ADC 146 to a center frequency of 0 (DC). The output of the feedback mixer 772 is a complex signal. In some of those embodiments, the signal measurement module 780 is coupled to the output of the feedback mixer 772 and the amplitude and phase of the DC tone is measured by the signal measurement module 780. In those embodiments, the signal measurement module 780 may be an IIR, which measures the signal level in the real and imaginary part of the complex signal.

To measure the RF signals output by the transmit chain 120 using an FFT or Goertzel computation, the feedback mixer 772 down-converts the continuous wave tone to a pre-determined frequency. The output of the feedback mixer 772 is passed through the decimation chain 720, which filters and down-samples the signal from the sampling rate of the RF ADC 146 to the interface rate. In some of those embodiments, the signal measurement module 780 is coupled to the output of the decimation chain 720 and the amplitude and phase or the real and imaginary parts of the continuous wave tone are measured by the signal measurement module 780 by performing an FFT or Goertzel computation on the output of the decimation chain 720.

The controller 130 is configured to use the isolation pre-compensation module 400 and the signal measurement module 780 to estimate the amplitude $\alpha$, phase $\phi$, and envelope delay $\tau$ of the coupling from an aggressor transmit chain 120 (in this example, transmit chain 120b) to a victim transmit chain 120 (in this example, transmit chain 120a). During system power-up, calibration signals (of known amplitude and frequency) are output by the aggressor transmit chain 120b and injected into the victim transmit chain 120a by the pre-compensation module 400b of the aggressor transmit chain 120b via the adder 370a of the victim transmit chain 120a. The victim transmit chain 120a outputs the calibration signal, which is received by the feedback chain 160 via the external loopback path 760 and measured by the signal measurement module 780. The output of the victim transmit chain 120a includes both the known calibration signals and coupling from the aggressor TX chain 120b. To isolate and measure the coupling from an aggressor transmit chain 120b to a victim transmit chain 120a, all other transmit chains 120 of the base station 100 are kept off. Because the calibration signals are known, the controller 130 is able to estimate the coupling in the signal output by the victim transmit chain 120a caused by the aggressor transmit chain 120b. The procedure is repeated to measure the coupling in each transmit chain 120 caused by each of the other transmit chains 120. If any of the transmit chains 120 include more than one band, the procedure is repeated to measure the coupling in each signal band of each transmit chain 120 caused by each signal band of each of the other transmit chains 120 while all other bands in the base station 100 are kept off.

For example, the pre-compensation module 400b may inject a continuous wave of known frequency $f_C$ to the victim transmit chain 120a. For this calibration signal, the output of the power amplifier 728 is a continuous wave tone at the frequency of the local oscillator (LO)+$f_C$. In this example, the carrier (LO) frequency of the aggressor transmit chain 120b is equal to the carrier (LO) frequency of the victim transmit chain 120a. The coupling from the aggressor transmit chain 120b to the victim transmit chain 120a will also occur at the frequency (LO)+$f_C$. The calibration signal is also injected at frequency (LO) +$f_C$. Since the calibration signal and the coupling fall at the same frequency, they can be separated by changing the amplitude and/or phase of the calibration without changing the transmitted signal output from the aggressor transmit chain 120b.

The amplitude and phase of the continuous wave tone can then be estimated in multiple ways. For example, the continuous wave tone at the output of the power amplifier 728 can be down-converted by the feedback mixer 772 to DC (by mixing the output with LO+$f_C$) and the amplitude and phase of the resultant DC signal may be measured by the signal measurement module 780. Alternatively, the continuous wave tone at the output of the power amplifier 728 may be down-converted by the feedback mixer 772 to the baseband frequency and the amplitude and phase may be estimated by the signal measurement module 780 using a Fast Fourier Transform or a Goertzel computation.

As described in detail below, the controller 130 can estimate the amplitude $\alpha$ of the coupling by injecting two continuous wave calibration signals having the same frequency and two different known amplitudes. Similarly, the controller 130 can estimate the phase $\phi$ and the envelope delay $\tau$ by injecting two continuous wave calibration signals having the two different frequencies.

The signal from the transmit chain 120a to the feedback chain 160 passes through a channel having a channel coefficient h. Even if the channel coefficient h is unknown, the controller 130 can calculate that channel coefficient h using two continuous-wave calibration signals having the same frequency and equal-and-opposite amplitudes and measuring those two calibration signals using the signal measurement module 780. If two continuous-wave calibration signals having the same frequency $f_{C1}$ and equal-and-opposite amplitudes A and −A are injected into the transmit chain 120a and measurements $m_1$ and $m_2$ of those calibration signals are taken by the signal measurement module 780, the baseband model of those measurements $m_1$ and $m_2$ will be the following baseband models of equations 2 and 3.

$$m_1 = h(A + \alpha e^{-j\phi} e^{-j2\pi f_{C1}\tau}) \quad (2)$$

$$m_2 = h(-A + \alpha e^{-j\phi} e^{-j2\pi f_{C1}\tau}) \quad (3)$$

Equations 2 and 3 can be combined and reduced to equation 4.

$$h = \frac{m_1 - m_2}{2A} \quad (4)$$

Accordingly, for example as shown in equation 4, the channel coefficient h of the signal path from the transmit chain 120a to the feedback chain 160 can be calculated using the two measurements $m_1$ and $m_2$ of the two calibration signals and the known amplitude A of the calibration signals.

Equations 2 and 3 can also be combined and reduced to equation 5.

$$\alpha e^{-j\phi} e^{-j2\pi f_{B1}\tau} = \frac{m_1 + m_2}{2h} \quad (5)$$

Accordingly, for example as shown in equation 5, the amplitude $\alpha$ of the coupling may be estimated as $$\frac{m_1 + m_2}{2h}$$

using the measurements $m_1$ and $m_2$ of the two calibration signals and the channel coefficient h calculated, for example, using equation 4 above.

The phase of $$\frac{m_1 + m_2}{2h}$$

of equation 5 above can be reduced to equation 6.

$$\text{phase}_1 = \phi + 2\pi f_{C2}\tau \quad (6)$$

Injecting the same calibration signals at the first frequency $f_{C1}$ and a second frequency $f_{C2}$ yields the phase measurement in equation 6 above and the phase measurement of equation 7.

$$\text{phase}_2 = \phi + 2\pi f_{C2}\tau \quad (7)$$

The envelope delay $\tau$ can then be estimated as shown in equation 8.

$$\tau = \frac{\text{phase}_1 - \text{phase}_2}{2\pi(f_{C1} - f_{C2})} \quad (8)$$

and the phase offset can be estimated as shown in equation 9.

$$\phi = \frac{(\text{phase}_1 - 2\pi f_{C1}\tau) + (\text{phase}_2 - 2\pi f_{C2}\tau)}{2} \quad (9)$$

If a second calibration frequency $f_{C2}$ is chosen such that $f_{C2} = -f_{C1}$, then the envelope delay $\tau$ estimation can be reduced to the phase difference divided by $2\pi$ as shown in equation 10.

$$\tau = \frac{\text{phase}_1 - \text{phase}_2}{2\pi(2f_{C1})} \quad (10)$$

Similarly, the phase offset estimation can be reduced to the average of the two phase measurements as shown in equation 11.

$$\phi = \frac{\text{phase}_1 + \text{phase}_2}{2} \quad (11)$$

In some embodiments, the aggressor transmit chain 120b outputs the calibration signals, the pre-compensation module 400b injects those controls signals in the victim transmit chain 120a, and the signal measurement module 780 measures the calibration signals output by the victim transmit chain 120a in response to control signals received from the controller 130. In some of those embodiments, the controller 130 estimates the amplitude $\alpha$, the phase $\phi$, and the envelope delay $\tau$ of the coupling as described above.

During system power-up, the controller 130 estimates the amplitude $\alpha$, phase $\phi$ and envelope delay $\tau$ of coupling in the victim transmit chain 120a caused by the aggressor transmit chain 120b at the initial carrier frequencies $f_A$ and $f_B$ as described above. However, during mission mode operation, a transmit chain 120 may change carrier frequencies. While the amplitude $\alpha$ and envelope delay $\tau$ of the coupling may stay constant when a transmit chain 120 changes carrier frequencies, the phase of the coupling is dependent on difference between the carrier frequencies of the aggressor transmit chain 120b and the victim transmit chain 120b. Accordingly, during system power-up, the controller 130 may perform multiple calibration operations at different carrier frequencies to estimate the relationship between the carrier frequency difference of the transmit chains 120a and 120b and the required phase offset to compensate for the coupling.

Theoretically, the required phase offset $\phi$ is directly proportional to the carrier frequency difference. The controller 130 may then simply perform two calibration operations at two different carrier frequencies and identify the linear relationship between any change in either carrier frequency and the required change in the phase offset $\phi$. For example, the controller 130 may perform calibrations with a unit step change in a carrier frequency (e.g., a change in the carrier frequency of 1 kHz) and calculate the required change in phase offset $\phi_{1KHz}$. Then, if a carrier frequency of either transmit chain 120 changes by any multiple m of 1 kHz, the controller 130 can adjust the phase offset by an amount $m*\phi_{1KHz}$.

However, carrier frequency changes in 5G base stations 100 may be multiples of 100 kHz. Meanwhile, the phase offset estimations may not be precise enough to remain accurate when multiplied by a multiple m of 100, 200, etc. Therefore, the controller 130 may shift the carrier frequency of one of the transmit chains 120 by successively larger amounts and estimate the required changes in the phase offset for each successively larger change in carrier frequency. For example, the controller 130 may shift the carrier frequency of the aggressor transmit chain 120b or the victim transmit chain 120a by 1 kHz, 10 kHz, 100 kHz, etc., and calculate the required phase change $\phi_{1KHz}$ for a carrier frequency shift of 1 kHz, the required phase change $\phi_{10KHz}$ for a carrier frequency shift of 10 kHz, the required phase change $\phi_{100KHz}$ for a carrier frequency shift of 100 kHz, etc. Since changes in carrier frequency can then be expressed in terms of $m_{1KHZ}$ multiples of 1 kHz plus $m_{10KHz}$ multiples of 10 kHz plus $m_{100KHz}$ multiples of 100 kHz, etc., the controller 130 can adjust the phase offset as shown in equation 12.

$$\phi_{LO\ change} = m_{1KHz}\phi_{1KHz} + m_{10KHz}\phi_{10KHz} + m_{100KHz}\phi_{100KHz} \quad (12)$$

Figure 8:
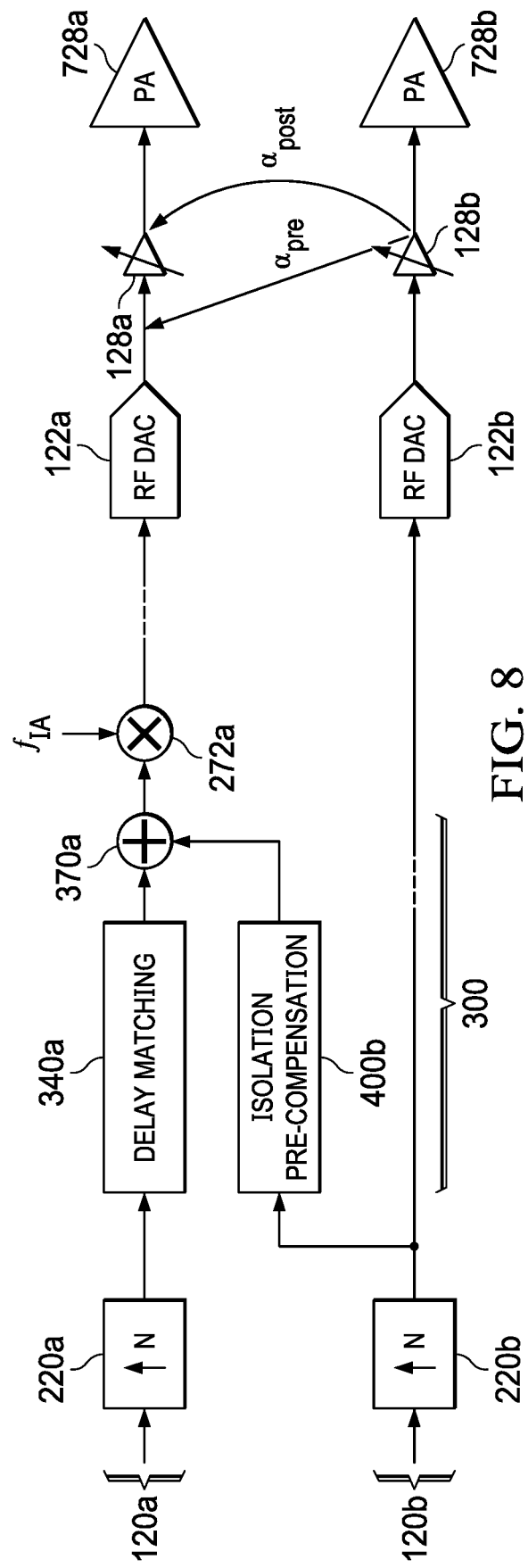
FIG. 8 is a block diagram illustrating coupling in a victim transmit chain caused by an aggressor transmit chain according to an illustrative embodiment.

FIG. 8 is another diagram illustrating the coupling in a victim transmit chain 120a caused by an aggressor transmit chain 120b according to an illustrative embodiment. This embodiment is applicable to an embodiment for any other pair of aggressor and victim transmit chains 120. As described above with reference to FIG. 1, in some embodiments each transmit chain 120 includes the RF sampling DAC 122 and a digital step attenuator (DSA) 128. As described above with reference to FIG. 2, in some embodiments each transmit chain 120 includes an interpolate-by-N filter 220 and a fine mixer 272. As described above with reference to FIG. 3, in some embodiments, for each band of each transmit chain 120, the TX-TX pre-compensation system 300 includes a delay matching module 340, an isolation pre-compensation module 400, and an adder 370. As described above with reference to FIG. 7, in some embodiments each transmit chain 120 includes a power amplifier 728. In the specific embodiment of FIG. 8, the transmit chain 120a includes an interpolate-by-N filter 220a, a delay matching module 340a, an adder 370a, a fine mixer 272a (that up-converts signals to an intermediate frequency $f_{LA}$), a RF DAC 122a, a DSA 128a, and a power amplifier 728a and the transmit chain 120b includes an interpolate-by-N filter 220b, an isolation pre-compensation module 400b, an RF DAC 122b, a DSA 128b, and a power amplifier 728b.

As shown in FIG. 8, the coupling from the aggressor transmit chain 120b to the victim transmit chain 120a may be from the output of the DSA 128b of the aggressor transmit chain 120b to both the output of the DSA 128a of the victim transmit chain 120a and the input of the DSA 128a of the victim transmit chain 120a. In the analog domain, the total amplitude α of the coupling is the sum of the amplitude $\alpha_{pre}$ of the coupling with the input of the DSA 128a of the transmit chain 120a and the amplitude $\alpha_{post}$ of the coupling with the output of the DSA 128a of the transmit chain 120a.

As mentioned briefly above, because the gain of each power amplifier 728 can vary with the temperature of the base station 100, each DSA 128 of each transmit chain 120 may be adjusted to compensate for variations in the gain of the power amplifier 128 of that transmit chain 120. For example, each DSA 128 may have 31 gain settings in 1-dB increments from 0 to 30 dB. The amplitude $\alpha_{pre}$ of the coupling with the input of the DSA 128a of the victim transmit chain 120a will vary in response to changes in the gain setting of the DSA 128b in the aggressor transmit chain 120b while remaining independent of the gain setting of the DSA 128a in the victim transmit chain 120a. For example, if the attenuation setting of the DSA 128b of the aggressor transmit chain 120b changes from 0 to 3 dB, then the coupling amplitude $\alpha_{pre}$ will also be reduced by 3 dB. However, if the DSA 128b of the aggressor transmit chain 120b remains at 0 dB, the coupling amplitude $\alpha_{pre}$ will remain the same irrespective of the setting of the DSA 128a of the victim transmit chain 120a.

The amplitude $\alpha_{post}$ will vary in response to changes in the gain setting of the DSA 128b of the aggressor transmit chain 120b while remaining independent of the gain setting of the DSA 128a of the victim transmit chain 120a. Therefore, when looking at the contribution of the pre-DSA coupling $\alpha_{pre}$ to the overall coupling amplitude α, the contribution of the pre-DSA coupling $\alpha_{pre}$ will be scaled by the setting of the DSA 128a of the victim transmit chain 120a. In other words, the contribution of the pre-DSA amplitude $\alpha_{pre}$ to the total coupling amplitude α will vary with the setting of the DSA 128a of the victim transmit chain 120a.

During power-up calibration, in some embodiments, the controller 130 determines the relationship between the gain settings of the DSAs 128a and 128b and the estimated amplitude α of the coupling from aggressor transmit chain 120b to the victim transmit chain 120a. The isolation pre-compensation module 400b can then inject pre-compensation signals having the appropriate estimated amplitude α even as the gain settings of the DSAs 128a and 128b are adjusted during mission mode operation.

In one embodiment, the controller 130 may simply perform the calibration process described above using every combination of DSA gain settings and store the estimated amplitude α of the coupling for each combination. However, because each DSA 128a and 128b may have as many as 31 gain settings, the controller 130 in those embodiments will have to store 961 amplitude estimates for each pair of aggressor and victim transmit chains 120.

Therefore, in other embodiments, the controller 130 estimates the relationship between the gain settings of each DSA 128a and 128b and the amplitude $\alpha_{post}$ of the coupling with the output of the DSA 128a. In those embodiments, the coupling coefficient α for the victim transmit chain 120a is split into two components, $\alpha_{pre}$ and $\alpha_{post}$. In those embodiments, the controller 130 performs calibration measurements to estimate two amplitudes $\alpha_1$ and $\alpha_2$ using two different gain settings $g_{a1}$ and $g_{a2}$ of the DSA 128a of the victim transmit chain 120a. The overall coupling $\alpha_1$ and $\alpha_2$ can each be expressed as function of $\alpha_{pre}$ and $\alpha_{post}$. Since the two gain settings of the victim DSA 128a of the victim transmit chain 120a are $g_{a1}$ and $g_{a2}$ (and the $\alpha_{post}$ is independent of the gain settings of the DSA 128a of the victim transmit chain 120a), the coupling $\alpha_{pre}$ will be scaled by $g_{a1}$ and $g_{a2}$ and be added to the coupling $\alpha_{post}$ as shown in equations 13 and 14.

$$\alpha_{pre} \cdot g_{a1} + \alpha_{post} = \alpha_1 \quad (13)$$

$$\alpha_{pre} \cdot g_{a2} + \alpha_{post} = \alpha_2 \quad (14)$$

Because $g_{a1}$ and $g_{a2}$ are known and $\alpha_1$ and $a_2$ are measured, the controller 130 can determine $\alpha_{pre}$ and $\alpha_{post}$ during power-up calibration. Then, during mission mode operation, the controller 130 can estimate the amplitude α of the coupling using the known gain setting of the DSA 128b of the aggressor transmit chain 120b and the known gain setting of the DSA 128a of the victim transmit chain 120a and the determined relationship between those gain settings and the amplitude α of the coupling.

In the digital domain, the correction coefficients corresponding to $\alpha_{pre}$ and $\alpha_{post}$ are $\alpha_{pre,corr}e^{j\phi}$ and $\alpha_{post,corr}e^{j\phi}$ where $\alpha_{pre,corr}=-\alpha_{pre}$ and $\alpha_{post,corr}=-\alpha_{post}$ and $\phi$ is the phase of the coupling, which is estimated based on the delay of the coupling from the aggressor transmit chain 120b to the victim transmit chain 120a. If the kth gain setting for the DSA 128b of the aggressor transmit chain 120b is $g_{bk}$, the final output is multiplied by $g_{bk}$, which will scale the pre- and post-DSA component of the amplitude correction in the digital domain. The ideal pre- and post-DSA correction factors to be added in the victim transmit chain 120a may be updated, for example, as shown in equations 15 and 16.

$$\alpha_{pre,corr}e^{j\phi}*g_{bk} \quad (15)$$

$$\alpha_{post,corr}e^{j\phi}*g_{bk} \quad (16)$$

The amplitude correction in the victim transmit chain 120a may be updated, for example, as shown in equation 17.

$$\alpha_{aggressor\ victim,pre,updt}=\alpha_{pre,corr}e^{j\phi}*g_{bk} \quad (17)$$

Finally, if the kth setting for the DSA 128a of the victim transmit chain 120a is $g_{ak}$, then the post-DSA amplitude correction may be updated, for example, as shown in equation 18.

$$\alpha_{aggressor\ victim,post,updt} = \frac{\alpha_{post,corr}e^{j\phi}g_{bk}}{g_{ak}} \quad (18)$$

Figure 9:
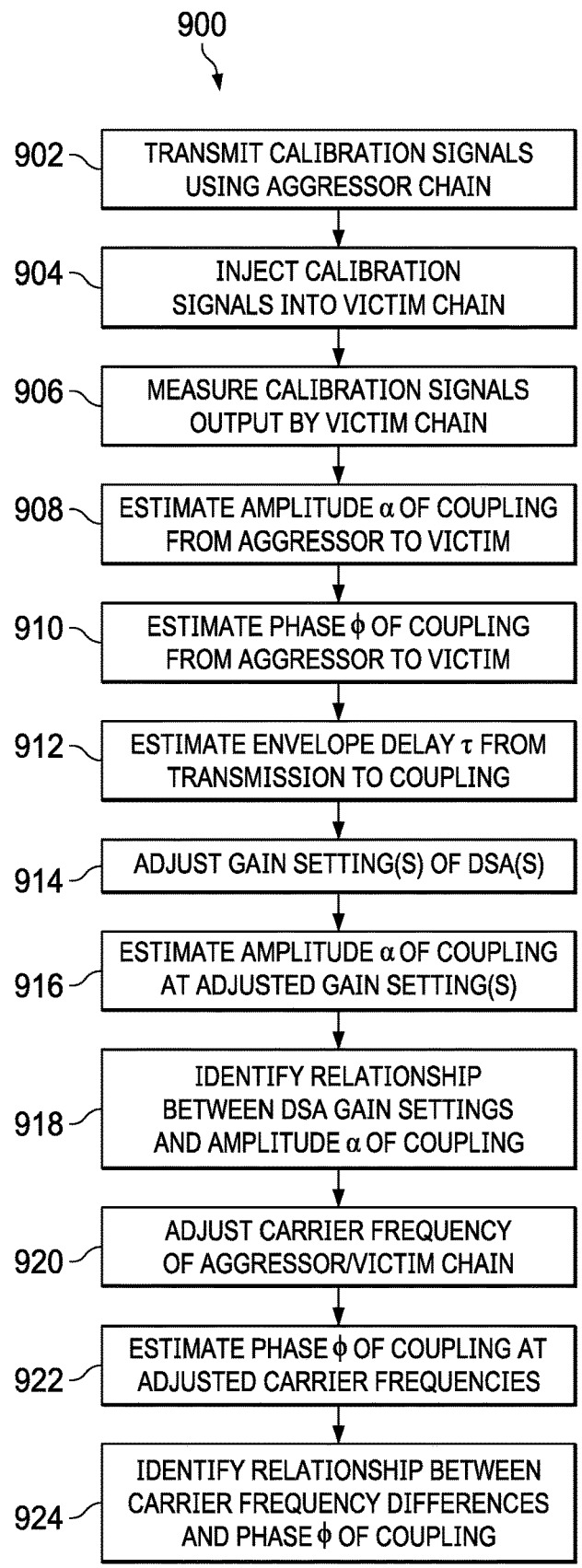
FIG. 9 is a flowchart illustrating a coupling estimation process according to an illustrative embodiment.

FIG. 9 is a flowchart illustrating a coupling estimation process 900 according to an illustrative embodiment. The coupling estimation process 900 may be performed by the controller 130 and the TX-TX pre-compensation system 300 described above. Embodiments of the coupling estimation process 900 are described below with reference to an aggressor transmit chain 120b and a victim transmit chain 120a. However, those embodiments are equally applicable to any pair of aggressor and victim transmit chains 120. The coupling estimation process 900 may be repeatedly performed for each pair of aggressor transmit chain 120b and victim transmit chain 120a in a base station 100 while all of the other transmit chains 120 of the base station 100 (if any) are turned off (e.g., during power-up of the base station 100). As one of ordinary skill in the art will recognize, some processing steps of the coupling estimation process 900 are optional. Furthermore, the processing steps of the coupling estimation process 900 do not necessarily have to be performed in the order shown in FIG. 9 and described below.

Calibration signals having known amplitudes and frequencies are transmitted using an aggressor transmit chain 120b in step 902. Those calibration signals are injected into a victim transmit chain 120a in step 904. As described above with reference to FIG. 7, for example, the calibration signals transmitted by the aggressor transmit chain 120b may be injected into the victim transmit chain 120a by an isolation pre-compensation module 400 (e.g., the isolation pre-compensation module 400b of the aggressor transmit chain 120b) coupled to the adder 370a of the TX-TX pre-compensation system 300 for the victim transmit chain 120a.

The calibration signals output by the victim transmit chain 120a are measured in step 906. As described above with reference to FIG. 7, for example, the calibration signals output by the victim transmit chain 120a may be measured by a signal measurement module 780 of a feedback chain 160 of the base station 100 (e.g., using a fast Fourier transform, a Goertzel computation, DC offset estimation, etc.). Steps 902 through 906 may be repeatedly performed for a number of calibration signals having a known amplitude and frequency. As described above with reference to FIG. 7, for example, calibration signals having amplitudes A and −A and frequencies $f_{C1}$ and $f_{C2}$ may be transmitted by the aggressor transmit chain 120b and injected into the victim transmit chain 120a. In those embodiments, the baseband model of the measurements m of the signals output by the victim transmit chain 120a can be characterized by the equations 2 and 3 above.

Using the calibration measurements obtained in step 906 and the known amplitudes and frequencies of the calibration signals, the amplitude α of the coupling from the aggressor transmit chain 102b to the victim transmit chain 102a is estimated in step 908, the phase of the of the coupling from the aggressor transmit chain 102b to the victim transmit chain 102a is estimated in step 910, and the envelope delay τ between the output of the calibration signals by the aggressor transmit chain 102b and the coupling in the victim transmit chain 102a is estimated in step 912. As described above with reference to FIG. 7, for example, the amplitude α of the coupling may be estimated by taking two measurements m of two calibration signals having known amplitudes of A and −A and a known frequency $f_{C1}$, estimating the channel coefficient h of the feedback path using equation 4 above, and estimating the amplitude α of the coupling using equation 5 above, the estimated channel coefficient h, and the measurements m of the calibration signals. In those embodiments, the phase $\phi$ the coupling may be estimated by taking measurements m of calibration signals known frequencies $f_{C1}$ and $f_{C2}$ and estimating the phase of the coupling using equation 9 above, the phases $phase_1$ and $phase_2$ of equation 5 above, and the known frequencies $f_{C1}$ and $f_{C2}$. In those embodiments, the envelope delay τ between of the signal output by the aggressor transmit chain 102b and the coupling in the victim transmit chain 102a may be estimated using equation 8 above, the phases $phase_1$ and $phase_2$ of equation 5 above, and known frequencies $f_{C1}$ and $f_{C2}$. Alternatively, in embodiments where $f_{C2}=-f_{C1}$, the phase $\phi$ of the coupling may be estimated by using equation 11 above and the phases $phase_1$ and $phase_2$ of equation 5 above at those known frequencies $f_{C1}$ and $-f_{C1}$. In those embodiments, the envelope delay τ between of the signal output by the aggressor transmit chain 102b and the coupling in the victim transmit chain 102a may be estimated using equation 10 above to average the phases $phase_1$ and $phase_2$ of equation 5 above at the frequencies $f_{C1}$ and $-f_{C1}$.

The gain setting of the DSA 128a of the victim transmit chain 120a (and, in some embodiments, the gain setting of the DSA 128b of the aggressor transmit chain 120b) is adjusted in step 914. For example, calibration signals may be transmitted by the aggressor transmit chain 120b (using a similar process as step 902) and injected into the victim transmit chain 120a (using a similar process as step 904) while the DSA 128a of the victim transmit chain 120a (or both DSAs 128a and 128b) uses the adjusted gain setting. The amplitude α of the coupling at the adjusted DSA gain setting(s) is estimated in step 916. For example, the calibration signals output by the victim transmit chain 120a may be measured (using a similar process as step 906) and the amplitude α of the coupling while the victim transmit chain 120a (or both transmit chains 120a and 120b) use the adjusted DSA gain setting(s) may be estimated using equation 5 above and the measurements m of the calibration signals (similar to the process of step 908 above). The relationship between the DSA gain settings and the amplitude α of the coupling is identified in step 918. As described above with reference to FIG. 8, in some embodiments, the relationship between the amplitude α of the coupling and the DSA gain settings may be identified by repeatedly performing steps 914 and 916 for every combination of aggressor DSA 128b gain setting and victim DSA 128a gain setting and estimating the amplitude α of the coupling in the victim transmit chain 120a using every gain setting of the DSA 128a caused by the aggressor transmit chain 120b using every gain setting of the DSA 128b. In other embodiments, the amplitudes $\alpha_1$ and $a_2$ of the coupling while using two gain settings $g_{a1}$ and $g_{a2}$ of the DSA 120a of the victim transmit chain 120a may be estimated in steps 914 and 916. In those embodiments, the relationship between the pre-DSA component $\alpha_{pre}$ and the post-DSA component $\alpha_{post}$ of the amplitude α of the coupling may be determined by the controller 130 in step 918 using equations 13 and 14 above, the estimated amplitudes $\alpha_1$ and $\alpha_2$ of the coupling, and the two gain settings $g_{\alpha 1}$ and $g_{\alpha 2}$ of the victim DSA 120a. In those embodiments, the correction factor for the pre-DSA component $\alpha_{pre}$ may be calculated by the controller 130 using equation 17 above, the gain setting $g_{bk}$ of the aggressor transmit chain 120b, and the estimated phase of the coupling; and the correction factor for the post-DSA component $\alpha_{post}$ may be calculated by the controller 130 using equation 18 above, the gain setting $g_{bk}$ of the aggressor transmit chain 120b, the gain setting $g_{ak}$ of the victim transmit chain 120a, and the estimated phase of the coupling.

To adjust the frequency difference between the carrier frequencies of the aggressor transit chain 120b and the victim transmit chain 120a, the carrier frequency of the aggressor and/or victim transmit chain 120 is adjusted in step 920. The phase φ of the coupling (while the aggressor and/or victim transmit chain 120 uses the adjusted carrier frequency) is estimated in step 922. For example, calibration signals may be transmitted by the aggressor transmit chain 120b (using a similar process as step 902 above), injected into the victim transmit chain 120a (using a similar process as step 904 above) and measured (using a similar process as step 906 above) while the aggressor and/or victim transmit chain 120 uses the adjusted carrier frequency. In those embodiments, the phase of the coupling (while the aggressor and/or victim transmit chain 120 uses the adjusted carrier frequency) may be estimated using equation 9 or equation 11 above (similar to the process of step 910 above). Steps 920 and 922 may be repeatedly performed with unit step changes in the carrier frequencies, progressively larger changes in the carrier frequencies, etc. Using the carrier frequencies selected in step 920 and the phase estimates calculated in step 922, the relationship between the carrier frequency difference and the phase of the coupling is identified in step 924. As described above with reference to FIG. 7, for example, in some embodiments, the carrier frequency of a transmit chain 120a or 120b may be adjusted in step 922 by a unit step change (e.g., a change in the carrier frequency of 1 kHz) and the phase change $\phi_{1KHz}$ for each unit step change in carrier frequency may be calculated by the controller 130 in step 924. In other embodiments, the carrier frequency of a transmit chain 120a or 120b may be repeatedly adjusted in step 920 by progressively larger changes amounts of 1 kHz, 10 kHz, 100 kHz, etc., and the phase changes $\phi_{1KHz}$, $\phi_{10KHz}$, $\phi_{100KHz}$, for each progressively larger change in carrier frequency may be estimated by the controller 130 in step 924. In those embodiments, the relationship between a change in carrier frequency and the phase adjustment $\phi_{LO\ change}$ to compensate for the coupling is shown in equation 12 above.

As described above, the coupling estimation process 900 may be performed to estimate the amplitude α (using multiple DSA gain settings), the phase φ (using multiple carrier frequencies), and the envelope delay τ of coupling in a victim transmit chain 120a caused by an aggressor transmit chain 120b. To estimate the coupling in each band of each transmit chain 120 in a base station 100 caused by each band of each of the other transmit chains 120 in a base station 100, the coupling estimation process 900 may be repeatedly performed using each band of each transmit chain 120 in the base station 100 as an aggressor and each band of each of the other transmit chains 120 in the base station 100 as a victim.

Figure 10:
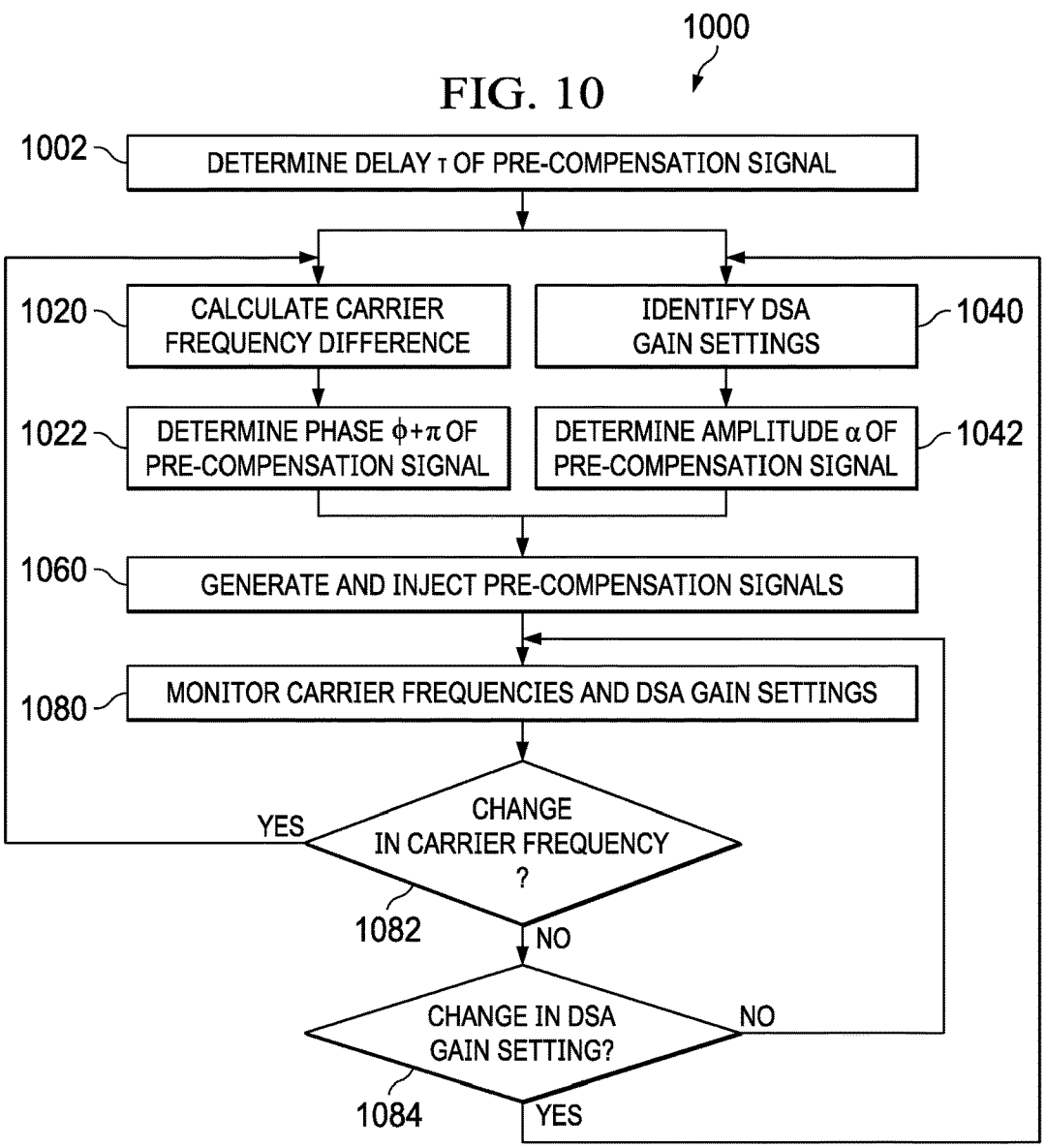
FIG. 10 is a flowchart illustrating a coupling pre-compensation process according to an illustrative embodiment.

FIG. 10 is a flowchart illustrating a coupling pre-compensation process 1000 according to an illustrative embodiment. As one of ordinary skill in the art will recognize, some processing steps of the coupling pre-compensation process 1000 are optional. Furthermore, the processing steps of the coupling pre-compensation process 1000 do not necessarily have to be performed in the order shown in FIG. 10 and described below. The coupling pre-compensation process 1000 described below is an embodiment to pre-compensate for the coupling in a victim transmit chain 120a caused by an aggressor transmit chain 120b. That embodiment is equally applicable pre-compensate for the coupling in any band of any transmit chain 120 caused by any band of any other transmit chain 120.

A delay τ for a pre-compensation signal for pre-compensating for coupling in a victim transmit chain 120a caused by an aggressor transmit chain 120b is determined in step 1002. The delay τ may be determined by the controller 130, for example, to be equal to the estimated envelope delay τ between the signal output by the aggressor transmit chain 120b and the coupling in the victim transmit chain 120a caused by the aggressor transmit chain 120b. The envelope delay τ between the signal output by the aggressor transmit chain 120b and the coupling in the victim transmit chain 120a may be estimated by the controller 130, for example as described above in step 912 of the coupling estimation process 900.

The initial carrier frequency difference between the carrier frequencies of the victim transmit chain 120a and the aggressor transmit chain 120b is calculated in step 1020. As described above, the initial carrier frequencies of each transmit chain 120 of the base station 100 may be provided to the controller 130. Accordingly, the controller 130 may calculate the difference between the initial carrier frequencies of the aggressor transmit chain 120b and the victim transmit chain 120a in step 1020. A phase φ+π of the pre-compensation signal for pre-compensating for coupling in the victim transmit chain 120a caused by the aggressor transmit chain 120b is determined in step 1022. The phase φ+π of the pre-compensation signal may be determined by the controller 130, for example, to be equal to the estimated phase of the coupling in the victim transmit chain 120a caused by the aggressor transmit chain 120b offset by π. The phase φ of the coupling in the victim transmit chain 120a caused by the aggressor transmit chain 120b may be estimated by the controller 130, for example, based on the carrier frequency difference identified in step 1020 and the relationship between the carrier frequency differences and the phase of the coupling identified in step 924 of the coupling estimation process 900.

The initial gain settings of the DSA 128a of the victim transmit chain 120a and the DSA 128b of the aggressor transmit chain 120b are identified in step 1040. As described above, the controller 130 may determine the initial gain setting of each DSA 128 of the base station 100 in view of the current conditions (e.g., temperature) of the base station 100. Accordingly, in step 1040 of the pre-compensation process 1000, the controller 130 may identify the initial gain settings of the DSAs 128a of the victim transmit chain 120a and the DSA 128b of the aggressor transmit chain 120b. An amplitude α of the pre-compensation signal for pre-compensating for coupling in the victim transmit chain 120a caused by the aggressor transmit chain 120b is determined in step 1042. The amplitude α of the pre-compensation signal may be determined by the controller 130, for example, with a magnitude equal to the estimated amplitude α of the coupling in the victim transmit chain 120a caused by the aggressor transmit chain 120b. The amplitude α of the coupling in the victim transmit chain 120a caused by the aggressor transmit chain 120b may be estimated by the controller 130 based on the initial gain settings of the DSAs 128a and 128b identified in step 1040 and the relationship between the DSA gain settings and the amplitude α of the coupling identified in step 918 of the coupling estimation process 900.

A pre-compensation signal having the amplitude α determined in step 1042, the phase φ+τ determined in step 1022, and the delay τ determined in step 1002 is generated by the isolation pre-compensation module 400b coupled to the adder 370a in the victim transmit chain 120a and added to the signal output by the victim transmit chain 120a, via the adder 370a, by the isolation pre-compensation module 400b in step 1060. In the embodiments of FIGS. 4-6, for instance, the delay τ of the pre-compensation signal is generated by the delay generation module 420b and the amplitude α and phase φ+π of the pre-compensation signal are generated by the amplitude and frequency translation module 460b.

In some embodiments, the controller 130 monitors the carrier frequencies of the transmit chains 120a and 120b and the gain settings of the DSAs 128a and 128b in step 1080. As described above, for example, the controller 130 may adjust a carrier frequency of one of the transmit chains 120a and/or 120b as needed. The controller 130 may also adjust a gain setting of a DSA 128a or 128b in response to a change in the condition (e.g., temperature) of the base station 100 or receive an interrupt indicating a gain setting of a DSA 128a or 128b has been changed by an (internal or external) autonomous automatic gain controller. In response to a change in a carrier frequency (step 1082: Yes), an updated carrier frequency difference is calculated in step 1020, an updated phase φ+π of the pre-compensation signal is determined in step 1022 in accordance with the updated carrier frequency difference, and a pre-compensation signal having the updated phase φ+π is generated and added in step 1060. In response to a change in gain setting of a DSA 128a or 128b, the updated gain settings are identified in step 1040, an updated amplitude α of the pre-compensation signal is determined in step 1042 in accordance with the updated gain settings, and a pre-compensation signal having the updated amplitude α is generated and added in step 1060.

In the embodiments described above, the pre-compensation signals are injected by the TX-TX pre-compensation system 300 at the input of the fine mixers 272 as shown in FIG. 3. However, the TX-TX pre-compensation system 300 is not so limited. Instead, the pre-compensation signals may be injected at any stage of the transmit chains 120. For example, in a single band transmit chain 120 in which the carrier frequencies for all the transmit chains 120 are the same, the pre-compensation with the cross-coupled pairs of transmit chains 120 may be done at the interface rate. Similarly, the pre-compensation can also be done at the sampling rate of the RF DAC 122. In fact, one advantage of injecting pre-compensation signals at the sampling rate of the RF DAC 122 is that it will provide wide frequency band visibility and the pre-compensation can be done even if the carrier frequencies of the transmit chains are widely separated.

Furthermore, in the embodiments described above, the TX-TX pre-compensation system 300 pre-compensates for coupling between transmit chains 120 in an RF-sampling transceiver. However, the TX-TX pre-compensation system 300 is not limited in this regard and may be easily adapted to pre-compensate for coupling between transmit chains 120 in a zero-IF (intermediate frequency) transceiver or other architecture.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device.

Circuits described herein are reconfigurable to include the replaced components to provide functionality at least partially similar to functionality available prior to the component replacement. Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described embodiments, and other embodiments are possible, within the scope of the claims.

What is claimed is:

1. A method for pre-compensating for coupling between transmit chains, the method comprising:
  estimating the coupling in a first transmit chain caused by a second transmit chain;
  generating a pre-compensation signal, based on the step of estimating the coupling in the first transmit chain caused by the second transmit chain, configured to cancel out the estimated coupling in the first transmit chain; and adding the pre-compensation signal into the first transmit chain;
wherein:
estimating the coupling comprises estimating an envelope delay between a signal output by the second transmit chain and the coupling in the first transmit chain; and
the pre-compensation signal is generated such that the pre-compensation signal is delayed by the estimated envelope delay between the signal output by the second transmit chain and the coupling in the first transmit chain.

2. A method for pre-compensating for coupling between transmit chains, the method comprising:
estimating the coupling in a first transmit chain caused by a second transmit chain;
generating a pre-compensation signal, based on the step of estimating the coupling in the first transmit chain caused by the second transmit chain, configured to cancel out the estimated coupling in the first transmit chain;
adding the pre-compensation signal into the first transmit chain;
wherein:
estimating the coupling comprises estimating an amplitude of the coupling; and
the pre-compensation signal is generated such that the pre-compensation signal has an amplitude with a magnitude that is equal to the estimated amplitude of the coupling; and
wherein:
the second transmit chain and the first transmit chain each include an attenuator having a plurality of gain settings; and
the amplitude of the coupling is dependent on the gain settings of both the attenuator of the second transmit chain and the attenuator of the first transmit chain.

3. The method of claim 2, wherein estimating the amplitude of the coupling comprises:
estimating a relationship between the amplitude of the coupling and the gain settings of both the attenuator of the second transmit chain and the attenuator of the first transmit chain;
identifying the gain settings of both the attenuator of the second transmit chain and the attenuator of the first transmit chain; and
estimating the amplitude of the coupling based on the gain setting of the attenuator of the second transmit chain, the gain setting of the attenuator of the first transmit chain, and the estimated relationship between the amplitude of the coupling and the gain settings of the attenuators of the second transmit chain and the first transmit chain.

4. The method of claim 3, further comprising:
monitoring the gain settings of both the attenuator of the second transmit chain and the attenuator of the first transmit chain; and
adjusting the pre-compensation signal in response to a change in the gain setting of either the attenuator of the second transmit chain or the attenuator of the first transmit chain.

5. A method for pre-compensating for coupling between transmit chains, the method comprising:
estimating the coupling in a first transmit chain caused by a second transmit chain;
generating a pre-compensation signal, based on the step of estimating the coupling in the first transmit chain caused by the second transmit chain, configured to cancel out the estimated coupling in the first transmit chain; and
adding the pre-compensation signal into the first transmit chain;
wherein:
estimating the coupling comprises estimating a phase of the coupling; and
the pre-compensation signal is generated such that a phase of the pre-compensation signal is shifted 180 degrees from the estimated phase of the estimated coupling and
wherein:
the second transmit chain and the first transmit chain each have a carrier frequency; and
the phase of the coupling is dependent on a carrier frequency difference between the carrier frequency of the second transmit chain and the carrier frequency of the first transmit chain.

6. The method of claim 5, wherein estimating a phase of the coupling comprises:
estimating a relationship between the phase of the coupling and the carrier frequency difference;
identifying the carrier frequency of the second transmit chain;
identifying the carrier frequency of the first transmit chain; and
estimating the phase of the coupling based on the carrier frequency difference and the relationship between the carrier frequency difference and the phase of the coupling.

7. The method of claim 6, further comprising:
monitoring the carrier frequency of the second transmit chain;
monitoring the carrier frequency of the first transmit chain; and
adjusting the pre-compensation signal in response to a change in the carrier frequency of the second transmit chain or a change in the carrier frequency of the first transmit chain.

8. A pre-compensation system, comprising:
a signal measurement module operable to estimate coupling in a first transmit chain caused by a second transmit chain; and
an isolation pre-compensation module operable to:
generate a pre-compensation signal based on the estimated coupling in the first transmit chain caused by the second transmit chain; and
add the pre-compensation signal into the first transmit chain;
wherein:
the signal measurement module is operable to estimate an envelope delay between a signal output by the second chain and the coupling in the first transmit chain; and
the isolation pre-compensation module is operable to generate the pre-compensation signal such that the pre-compensation signal is delayed by the estimated envelope delay between the signal output by the second chain and the coupling in the first transmit chain.

9. A pre-compensation system, comprising:
a signal measurement module operable to estimate coupling in a first transmit chain caused by a second transmit chain; and
an isolation pre-compensation module operable to:
generate a pre-compensation signal based on the estimated coupling in the first transmit chain caused by the second transmit chain; and add the pre-compensation signal into the first transmit chain;

wherein:

the signal measurement module is operable to estimate an amplitude of the coupling; and the isolation pre-compensation module is operable to generate the pre-compensation signal such that the pre-compensation signal has an amplitude with a magnitude that is equal to the estimated amplitude of the coupling; and wherein:

the second transmit chain and the first transmit chain each include an attenuator having a plurality of gain settings; and the amplitude of the coupling is dependent on the gain settings of both the attenuator of the second transmit chain and the attenuator of the first transmit chain.

10. The system of claim 9, wherein the signal measurement module is operable to estimate the amplitude of the coupling by:

estimating a relationship between the amplitude of the coupling and the gain settings of both the attenuator of the second transmit chain and the attenuator of the first transmit chain;

identifying the gain settings of both the attenuator of the second transmit chain and the attenuator of the first transmit chain; and estimating the amplitude of the coupling based on the gain setting of the attenuator of the second transmit chain, the gain setting of the attenuator of the first transmit chain, and the relationship between the amplitude of the coupling and the gain settings of the attenuators of the second transmit chain and the first transmit chain.

11. The system of claim 10, wherein the isolation pre-compensation module is operable to adjust the pre-compensation signal in response to a change in the gain setting of either the attenuator of the second transmit chain or the attenuator of the first transmit chain.

12. A pre-compensation system, comprising:

a signal measurement module operable to estimate coupling in a first transmit chain caused by a second transmit chain; and an isolation pre-compensation module operable to:

generate a pre-compensation signal based on the estimated coupling in the first transmit chain caused by the second transmit chain; and add the pre-compensation signal into the first transmit chain;

wherein:

the signal measurement module is operable to estimate a phase of the coupling; and the isolation pre-compensation module is operable to generate the pre-compensation signal such that a phase of the pre-compensation signal is shifted 180 degrees from the estimated phase of the estimated coupling; and wherein:

the second transmit chain and the first transmit chain each have a carrier frequency;

the phase of the coupling is dependent on a carrier frequency difference between the carrier frequency of the second transmit chain and the carrier frequency of the first transmit chain; and the signal measurement module is operable to estimate a phase of the coupling by:

estimating a relationship between the phase of the coupling and the carrier frequency difference;

identifying the carrier frequency of the second transmit chain;

identifying the carrier frequency of the first transmit chain; and estimating the phase of the coupling based on the carrier frequency of the second transmit chain, the carrier frequency of the first transmit chain, and the relationship between the carrier frequency difference and the phase of the coupling.

13. The system of claim 12, wherein the isolation pre-compensation module is operable to adjust the pre-compensation signal in response to a change in the carrier frequency of the second transmit chain or a change in the carrier frequency of the first transmit chain.

14. A method for pre-compensating for coupling in a first transmit chain having a first carrier frequency caused by a second transmit chain having a second carrier frequency, the method comprising:

estimating an amplitude of the coupling;

estimating a phase of the coupling;

estimating an envelope delay between a signal output by the second transmit chain and the coupling;

generating a pre-compensation signal based on the estimated amplitude of the coupling, the estimated phase of the coupling, the estimated envelope delay between the signal output by the second transmit chain and the coupling, and a frequency difference between the second carrier frequency and the first carrier frequency; and adding the pre-compensation signal into the first transmit chain.

* * * * *